(12) United States Patent
Yang et al.

(10) Patent No.: US 11,985,880 B2
(45) Date of Patent: May 14, 2024

(54) DISPLAY DEVICE

(71) Applicant: Samsung Display Co., Ltd., Yongin-si (KR)

(72) Inventors: Ji Seong Yang, Suwon-si (KR); Kang Uk Kim, Hwaseong-si (KR); Seon Uk Lee, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 377 days.

(21) Appl. No.: 17/129,613

(22) Filed: Dec. 21, 2020

(65) Prior Publication Data

US 2021/0320150 A1    Oct. 14, 2021

(30) Foreign Application Priority Data

Apr. 13, 2020  (KR) ........................ 10-2020-0044566

(51) Int. Cl.
  *H10K 59/38*  (2023.01)
  *H10K 50/84*  (2023.01)
  *H10K 50/86*  (2023.01)
  *H10K 59/122*  (2023.01)
  *H10K 59/88*  (2023.01)

(52) U.S. Cl.
  CPC ........... *H10K 59/38* (2023.02); *H10K 50/865* (2023.02); *H10K 59/88* (2023.02); *H10K 50/841* (2023.02); *H10K 59/122* (2023.02)

(58) Field of Classification Search
  CPC ...... H10K 59/38; H10K 50/865; H10K 59/88; H10K 50/841; H10K 59/122; H10K 59/126
  See application file for complete search history.

(56) References Cited

U.S. PATENT DOCUMENTS

| 10,048,530 B1 | 8/2018 | Kim et al. |
| 2019/0025634 A1 | 1/2019 | Park et al. |
| 2019/0137815 A1 | 5/2019 | Kim et al. |
| 2020/0251688 A1* | 8/2020 | Chung ................. H10K 50/844 |
| 2020/0295090 A1* | 9/2020 | Cho ....................... H10K 59/38 |

FOREIGN PATENT DOCUMENTS

| CN | 109283750 | 1/2019 |
| JP | 2009-224063 | 10/2009 |
| KR | 10-2019-0014140 | 2/2019 |
| KR | 10-1992217 | 6/2019 |
| KR | 10-2020812 | 9/2019 |

* cited by examiner

*Primary Examiner* — Jay C Kim
*Assistant Examiner* — Woo K Lee
(74) *Attorney, Agent, or Firm* — CANTOR COLBURN LLP

(57) ABSTRACT

A display device includes: a first substrate including a display area to emit a light having a peak wavelength from light emitting areas and a non-display area surrounding the display area; and a second substrate including transparent areas overlapping the light emitting areas and to convert the peak wavelength of the light or to transmit the light through the transparent areas. The second substrate includes: a base layer including the transparent areas, an inner light blocking area arranged between the transparent areas, and an outer light blocking area arranged outside the transparent areas; a color filter on the base layer; and a light blocking layer above the color filter and including an outer light blocking layer overlapping the outer light blocking area and an inner light blocking layer overlapping the inner light blocking area.

6 Claims, 17 Drawing Sheets

DISPLAY DEVICE

CROSS-REFERENCE TO RELATED APPLICATION

This application claims priority from and the benefit of Korean Patent Application No. 10-2020-0044566 filed on Apr. 13, 2020, which is hereby incorporated by reference for all purposes as if fully set forth herein.

BACKGROUND

Field

Exemplary implementations of the invention relate generally to a display device and more specifically, to a display device having a color conversion substrate.

Discussion of the Background

With the advance of information-oriented society, demands for display devices for displaying images are increased more and more in various areas. For example, display devices are used in various electronic devices such as smartphones, digital cameras, laptop computers, navigation devices, and smart televisions.

The display devices include a self-light emitting display device including a self-light emitting element such as an organic light emitting diode. The self-light emitting element includes two opposite electrodes and a light emitting layer formed therebetween. When the organic light emitting diode is used as the self-light emitting element, electrons and holes are supplied from the two opposite electrodes, and are recombined in the light emitting layer to produce excitons, which are transited from the excited state to the ground state to emit light.

Such a self-light emitting display device is spotlighted as a next-generation display because of being able to meet the high display quality requirements such as wide viewing angle, high brightness and contrast, and quick response speed as well as a low power consumption, lightweight, and thin due to no necessity of a separate power source.

The above information disclosed in this Background section is only for understanding of the background of the inventive concepts, and, therefore, it may contain information that does not constitute prior art.

SUMMARY

Applicant discovered that when a display substrate and a color conversion substrate of a display device are combined with a filler material therebetween, the thickness of the filler material does not maintain constant/uniform such that the display device has poor lamination and stains.

Display devices with a display substrate and a color conversion substrate constructed according to the principles and exemplary implementations of the invention prevent poor lamination and stains by allowing filler materials filled between the display substrate and the color conversion substrate to maintain an even thickness and regulating the thicknesses of wavelength conversion units and a light transmission unit to be even in such a way of forming outer and inner light blocking members to be substantially equal in height from a base member to one another.

Further, display devices with a display substrate and a color conversion substrate constructed according to the principles and exemplary implementations of the invention prevent poor lamination and stains by forming outer and inner light blocking members equal, in height from a base member, to one another in such a way of forming dummy pixels arranged in a non-display area on a display substrate and non-transparent areas corresponding to the non-light emitting areas of the dummy pixels on a color conversion substrate.

The effects of the present disclosure are not limited to the aforementioned effects, and various other effects are included in the present specification.

Additional features of the inventive concepts will be set forth in the description which follows, and in part will be apparent from the description, or may be learned by practice of the inventive concepts.

According to an exemplary embodiment, a display device includes: a first substrate including a display area configured to emit a light having a predetermined peak wavelength from a plurality of light emitting areas and a non-display area surrounding the display area; and a second substrate including a plurality of transparent areas overlapping the plurality of light emitting areas of the first substrate, the second substrate configured to convert the peak wavelength of the light or to transmit the light through the plurality of transparent areas, wherein the second substrate includes: a base layer including the plurality of transparent areas, an inner light blocking area arranged between the plurality of transparent areas, and an outer light blocking area arranged outside the plurality of transparent areas; a color filter disposed on the base layer; and a light blocking layer disposed above the color filter and including an outer light blocking layer overlapping the outer light blocking area and an inner light blocking layer overlapping the inner light blocking area, wherein the outer light blocking layer and the inner light blocking layer have substantially same heights from the base layer.

The first substrate is a display substrate, and the second substrate is a color conversion substrate, and wherein: the inner light blocking layer may include: a first inner light blocking layer disposed above the color filter; and a second inner light blocking layer disposed above the first inner light blocking layer.

The outer light blocking layer may include: a first outer light blocking layer disposed above the color filter and overlapping the outer light blocking area; and a second outer light blocking layer disposed partially above the first outer light blocking layer and partially above the base layer to overlap the non-display area.

The second outer light blocking layer may cover a top surface and an outer side surface of the first outer light blocking layer.

A width of the second outer light blocking layer may be wider than that of the first outer light blocking layer in a plan view.

A width of the outer light blocking layer may be wider than that of the inner light blocking layer in a plan view.

The second substrate may further include a capping layer covering the first inner light blocking layer and the first outer light blocking layer, and wherein the second inner light blocking layer and the second outer light blocking layer may be disposed directly on the capping layer.

The first inner light blocking layer and the first outer light blocking layer may include a black organic material, and the second inner light blocking layer and the second outer light blocking layer may include a black organic material and a liquid repellent component.

The outer light blocking layer and the inner light blocking layer may have respective heights from the base layer, and a difference between the heights of the outer light blocking layer and the inner light blocking layer may be within an error margin of about 3%.

the color filter may include: a first color filter configured to selectively pass a first color light therethrough and overlapping a first transparent area among the plurality of transparent areas; a second color filter configured to selectively pass a second color light therethrough and overlapping a second transparent area among the plurality of transparent areas; and a third color filter configured to selectively pass a third color light therethrough and overlapping the inner light blocking area, the outer light blocking area, and a third transparent area among the plurality of transparent areas.

The color conversion substrate may include: a first wavelength conversion layer disposed above the first color filter and including a first wavelength shifter configured to convert a peak wavelength of an incident light to a first peak wavelength; a second wavelength conversion layer disposed above the second color filter and including a second wavelength shifter configured to convert the peak wavelength of the incident light to a second peak wavelength different from the first peak wavelength; and a light transmission layer disposed above the third color filter and configured to pass the incident light therethrough while maintaining the peak wavelength of the incident light.

According to another exemplary embodiment, a display device includes: a first substrate including a display area and a non-display area surrounding the display area, the display area including a plurality of pixels configured to emit a light from a plurality of light emitting areas, the non-display area including a plurality of dummy pixels arranged in a plurality of non-light emitting areas; and a second substrate including a plurality of transparent areas overlapping the plurality of light emitting areas of the first substrate and a plurality of non-transparent areas overlapping the plurality of non-light emitting areas, wherein the second substrate includes: a base layer defining the plurality of transparent areas, the plurality of non-transparent areas, and a plurality of light blocking areas arranged between the plurality of transparent areas and the plurality of non-transparent area; a color filter disposed on the base layer; and a plurality of light blocking layers disposed above the color filter and including an outer light blocking layer surrounding outermost non-transparent areas among the plurality of non-transparent areas and an inner light blocking layer disposed inside the outer light blocking layer and overlapping the plurality of light blocking areas, wherein the outer light blocking layer and the inner light blocking layer have substantially same heights from the base layer.

The first substrate is a display substrate, and the second substrate is a color conversion substrate, and wherein: the inner light blocking layer may include: a first inner light blocking layer disposed above the color filter; and a second inner light blocking layer disposed above the first inner light blocking layer.

The outer light blocking layer may include: a first outer light blocking layer disposed above the color filter; and a second outer light blocking layer disposed partially above the first outer light blocking layer and partially above the base layer to cover an outer side surface of the first outer light blocking layer.

A width of the second outer light blocking layer may be wider than that of the first outer light blocking layer in a plan view.

A width of the outer light blocking layer may be wider than that of the inner light blocking layer in a plan view.

The outer light blocking layer and the inner light blocking layer may have respective heights from the base layer, and a difference between the heights of the outer light blocking layer and the inner light blocking layer may be within an error margin of about 3%.

The first inner light blocking layer and the first outer light blocking layer may include a black organic material, and the second inner light blocking layer and the second outer light blocking layer may include a black organic material and a liquid repellent component.

The color filter may include: a first color filter configured to selectively pass a first color light therethrough and overlapping a first transparent area among the plurality of transparent areas; a second color filter configured to selectively pass a second color light therethrough and overlapping a second transparent area among the plurality of transparent areas; and a third color filter configured to selectively pass a third color light therethrough and overlapping the plurality of light blocking areas and a third transparent area among the plurality of transparent areas.

The plurality of non-transparent areas may overlap at least two of the first color filter, the second color filter, and the third color filter.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
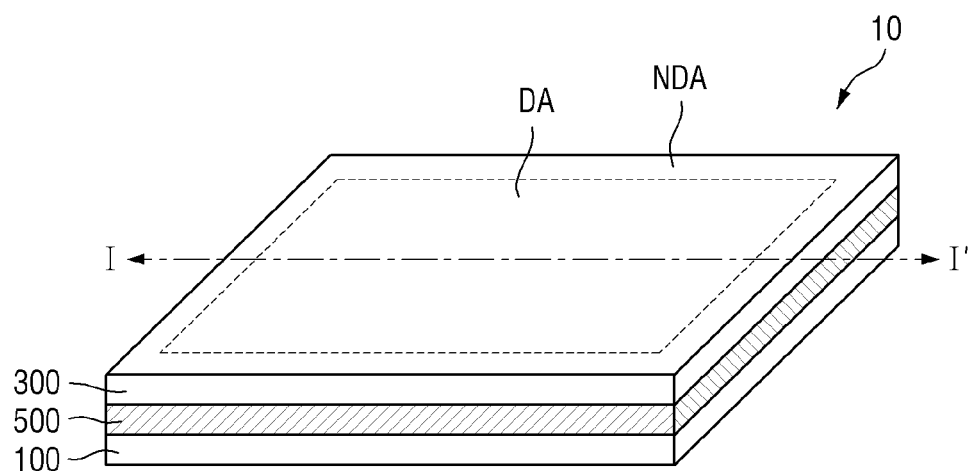
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
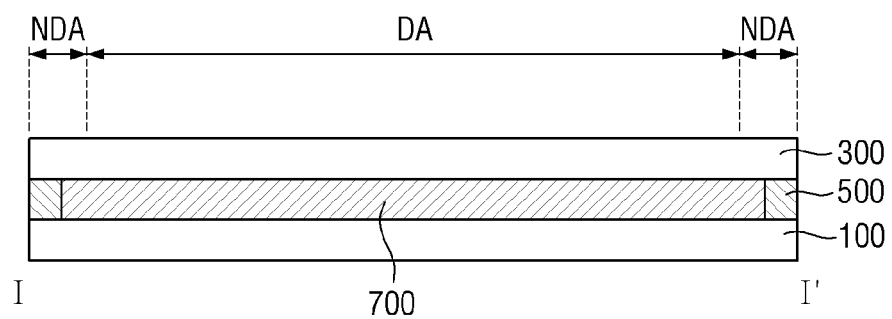
FIG. 2 is a cross-sectional view taken along line I-I' of FIG. 1.
Figure 2:
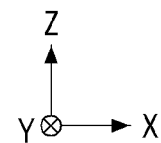

FIG. 1 is a perspective view of an exemplary embodiment of a display device constructed according to the principles of the invention, and FIG. 2 is a cross-sectional view taken along line I-I' of FIG. 1.

In the following description, the terms "upper side," "top," and "upper surface" are used to indicate a direction upward from a display device on the Z-axis, and the terms "lower side," "bottom," and "lower surface" are used to indicate a direction downward from the displace device on the Z-axis. The terms "left," "right," "up," and "down" are used to respectively indicate corresponding directions on the surface of the display device. For example, the term "left" indicates a negative direction on the X-axis, the term "right" indicates a positive direction on the X-axis, the term "up" indicates a positive direction on the Y-axis, and the term "down" indicates a negative direction on the Y-axis.

With reference to FIGS. 1 and 2, a display device 10, as a device for displaying a moving or still image, may be used as a display screen of various products such as a television, a laptop computer, a monitor, a billboard, and an Internet of Things (IoT) device as well as portable electronic devices such as a mobile phone, a smartphone, a tablet personal computer (PC), a smart watch, a watch phone, a mobile communication terminal, an electronic notebook, an eBook reader, a portable multimedia player (PMP), a navigation device, and an ultra-mobile PC (UMPC).

The display device 10 may have a rectangular shape in a plan view. For example, the display device 10 is designed in the form of a flat panel having a relatively long side in a first direction (X-axis direction) and a relatively short side in a second direction (Y-axis direction). A corner formed by the long side in the first direction (X-axis direction) and the short side in the second direction (Y-axis direction) may be rectangular or rounded to have a predetermined curvature. The flat panel of display device 10 may have other polygonal shapes, a circular shape, or elliptical shape without being limited to the rectangular shape. The display device 10 may also be designed to have a flat surface, but exemplary embodiments are not limited thereto. For example, the display device 10 may be designed to have a curved surface with a predetermined radius of curvature.

The display device 10 may include a display area DA, in which a plurality of pixels for displaying an image are disposed, and a non-display area NDA, in which the image is not displayed. For example, the non-display area NDA may be arranged around the display area DA and surround the display area DA.

The display device 10 may also include a first substrate, which may be in the form of a display substrate 100, a second substrate, which may be in the form of a color conversion substrate 300, a sealing member 500, and a filler material 700.

The display substrate 100 may emit light having a predetermined peak wavelength from a plurality of light emitting areas of the display area DA. The display substrate 100 may include elements and circuits for displaying the image. For example, the display substrate 100 may include pixel circuits such as a switching element, a self-light emitting element, and a pixel definition layer for defining a light emitting area of the display area DA.

For example, the self-light emitting element may include at least one of an organic light emitting diode, a quantum dot light emitting diode, an inorganic micro light emitting diode (e.g., micro LED), or an inorganic nano light emitting diode (e.g., nano LED). Hereinafter, exemplary embodiments will be described in the case where the self-light emitting element is an organic light emitting diode for descriptive convenience.

The color conversion substrate 300 may be disposed above the display substrate 100. The color conversion substrate 300 may include a plurality of transparent areas corresponding to the light emitting areas of the display substrate 100. The color conversion substrate 300 may convert the peak wavelength of light or transmit the light, which is emitted from the light emitting areas of the display substrate 100. For example, the display substrate 100 may emit light having predetermined peak wavelengths, and the color conversion substrate 300 may pass at least two lights having different peak wavelengths therethrough.

The sealing member 500 may be interposed between and along the edges of the display substrate 100 and the color conversion substrate 300. For example, the edges of the display substrate 100 and the color conversion substrate 300 may correspond to the non-display area NDA. The sealing member 500 interposed between the display substrate 100 and the color conversion substrate 300 may tightly seal the edges of the display substrate 100 and the color conversion substrate 300 to prevent the filler material 700 from being leaked. The display substrate 100 and the color conversion substrate 300 may be combined by the sealing member 500. The sealing member 500 may, for example, include an organic material. The sealing member 500 may be made of epoxy resin, but exemplary embodiments are not limited thereto.

The filler material 700 may be placed in the space formed by placing the sealing member 500 between and along the edges of the display substrate 100 and the color conversion substrate 300. The filler material 700 may be filled in the space formed between the display substrate 100 and the color conversion substrate 300. The filler material 700 may, for example, be a kind of organic material passing light therethrough. The filler material 700 may be made of a silicon organic material, an epoxy organic material, or the like, but exemplary embodiments are not limited thereto. As another example, the filler material 700 may be omitted.

Figure 3:
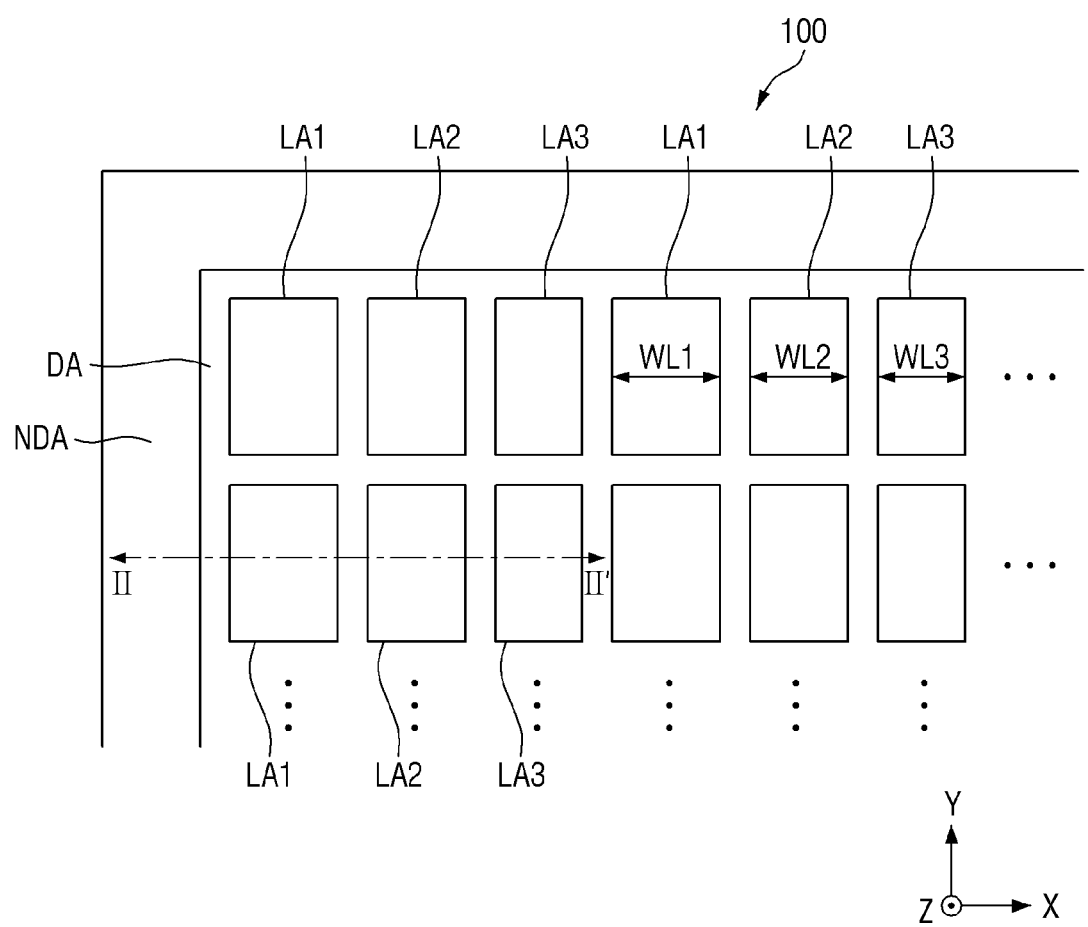
FIG. 3 is a schematic plan view illustrating an exemplary embodiment of a display substrate of the display device of FIG. 1.

FIG. 3 is a schematic plan view illustrating an exemplary embodiment of a display substrate of the display device of FIG. 1.

With reference to FIG. 3, the display substrate 100 may include a plurality of pixels arranged in rows and columns in the display area DA. Each of the pixels may have a light emitting area defined by a pixel definition layer to emit light having a predetermined peak wavelength. For example, the display area DA of the display substrate 100 may include first, second, and third light emitting areas LA1, LA2, and LA3. The first, second, and third light emitting areas LA1, LA2, and LA3 may be the areas for radiating the light, which is emitted by the light emitting element, outside the display substrate 100.

The first, second, and third light emitting areas LA1, LA2, and LA3 may each radiate light having a predetermined peak wavelength outside the display substrate 100. For example, the first, second, and third light emitting areas LA1, LA2, and LA3 may radiate blue light. The light radiated through the first, second, and third light emitting areas LA1, LA2, and LA3 may have a peak wavelength in the range from about 440 nm to about 480 nm.

The first, second, and third light emitting areas LA1, LA2, and LA3 may be arranged repetitively in the first direction (X-axis direction) in the display area DA. The first, second, and third light emitting areas LA1, LA2, and LA3 have widths WL1, WL2, and WL3 in the first direction (X-axis direction). The width WL1 of the first light emitting area LA1 may be wider than each of the widths WL2 and WL3 of the second and third light emitting areas LA2 and LA3. The width WL2 of the second light emitting area LA2 may be wider than the width WL3 of the third light emitting area LA3. Alternatively, the width WL1 of the first light emitting area LA1, the width WL2 of the second light emitting area LA2, and the width WL3 of the third light emitting area LA3 may be substantially equal to one another, but exemplary embodiments are not limited thereto.

For example, the size of the first light emitting area LA1 may be larger than each of those of the second light emitting area LA2 and the third light emitting area LA3. The size of the second light emitting area LA2 may be larger than that of the third light emitting area LA3. Alternatively, the sizes of the first light emitting area LA1, the second light emitting area LA2, and the third light emitting area LA3 may be substantially equal to one another, but exemplary embodiments are not limited thereto.

Figure 4:
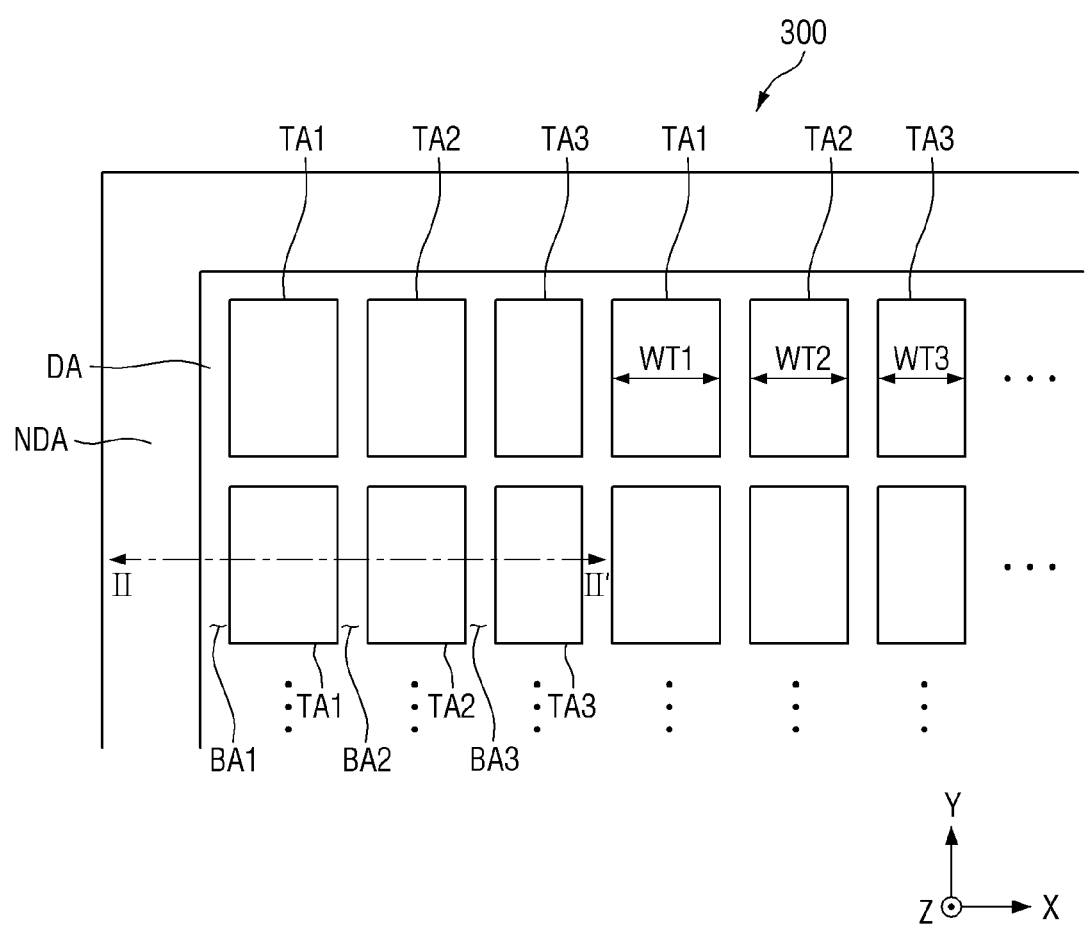
FIG. 4 is a schematic plan view illustrating an exemplary embodiment of a color conversion substrate of the display device of FIG. 1.

FIG. 4 is a schematic plan view illustrating an exemplary embodiment of a color conversion substrate of the display device of FIG. 1.

With reference to FIG. 4, the color conversion substrate 300 is disposed above the display substrate 100. The color conversion substrate 300 may include a plurality of transparent areas corresponding to the light emitting areas of the display substrate 100 and a plurality of light blocking areas surrounding the plurality of transparent areas. The color conversion substrate 300 may, for example, include first, second, and third transparent areas TA1, TA2, and TA3 and first, second, and third light blocking areas BA1, BA2, and BA3. The first, second, and third transparent areas TA1, TA2, and TA3 may respectively correspond to the first, second, and third light emitting areas LA1, LA2, and LA3 of the display substrate 100. The first, second, and third light blocking areas BA1, BA2, and BA3 may be arranged at one side of the first, second, and third transparent areas TA1, TA2, and TA3, respectively, to prevent the colored lights emitted through the first, second, and third transparent areas TA1, TA2, and TA3 from being mixed with one another.

The color conversion substrate 300 may convert the peak wavelength of light or transmit the light emitted from the light emitting areas of the display substrate 100. For example, the first transparent area TA1 may convert the peak wavelength of the light emitted from the display substrate 100 to radiate a first color light. The second transparent area TA2 may convert the peak wavelength of the light emitted from the display substrate 100 to radiate a second color light, which is the different color from the first color light. The third transparent area TA3 may pass the light emitted from the display substrate 100 therethrough without any peak wavelength conversion (e.g., peak wavelength conversion for generating a third color light, which is the different color from the first color light and the second color light). For example, the first color light may be a red light having a peak wavelength in the range from about 610 nm to about 650 nm, the second color light may be a green light having a peak wavelength in the range from about 510 nm to about 550 nm, and the third color light may be a blue light having a peak wavelength in the range from about 440 nm to about 480 nm.

The first, second, and third transparent areas TA1, TA2, and TA3 may be arranged repetitively in the first direction (X-axis direction) in the display area DA. The first, second, and third transparent areas TA1, TA2, and TA3 may have widths WT1, WT2, and WT3 in the first direction (X-axis direction). For example, the width WT1 of the first transparent area TA1 may be wider than each of the width WT2 of the second transparent area TA2 and the width WT3 of the third transparent area TA3. The width WT2 of the second transparent area TA2 may be wider than the width WT3 of the third transparent area TA3. Alternatively, the width WT1 of the first transparent area TA1, the width WT2 of the second transparent area TA2, and the width WT3 of the third transparent area TA3 may be substantially equal to one another, but exemplary embodiments are not limited thereto.

For example, the size of the first transparent area TA1 may be larger than each of those of the second transparent area TA2 and the third transparent area TA3. The size of the second transparent area TA2 may be larger than that of the third transparent area TA3. Alternatively, the sizes of the first transparent area TA1, the second transparent area TA2, and the third transparent area TA3 may be substantially equal in size to one another, but exemplary embodiments are not limited thereto.

Figure 5:
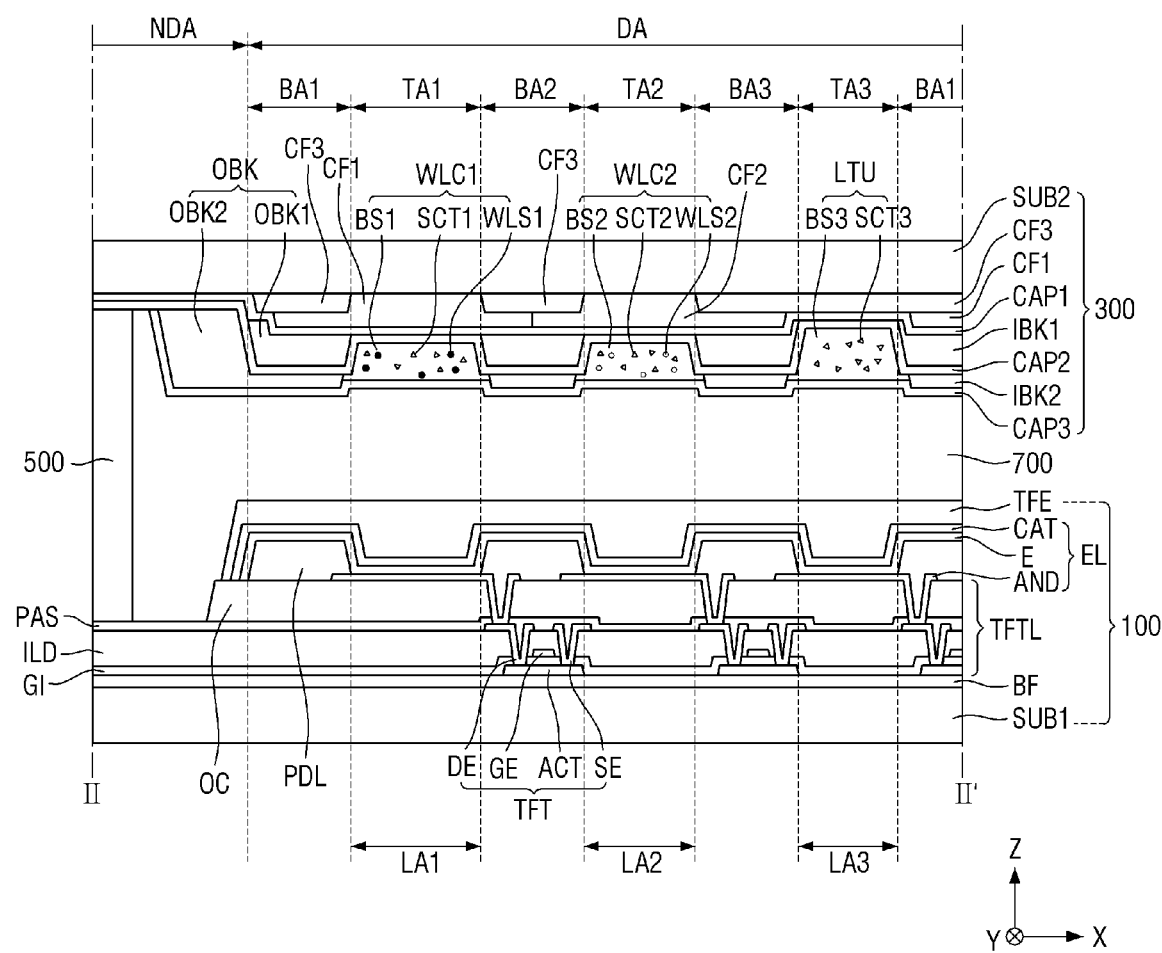
FIG. 5 is a cross-sectional view taken along line II-IF of FIGS. 3 and 4.
Figure 6:
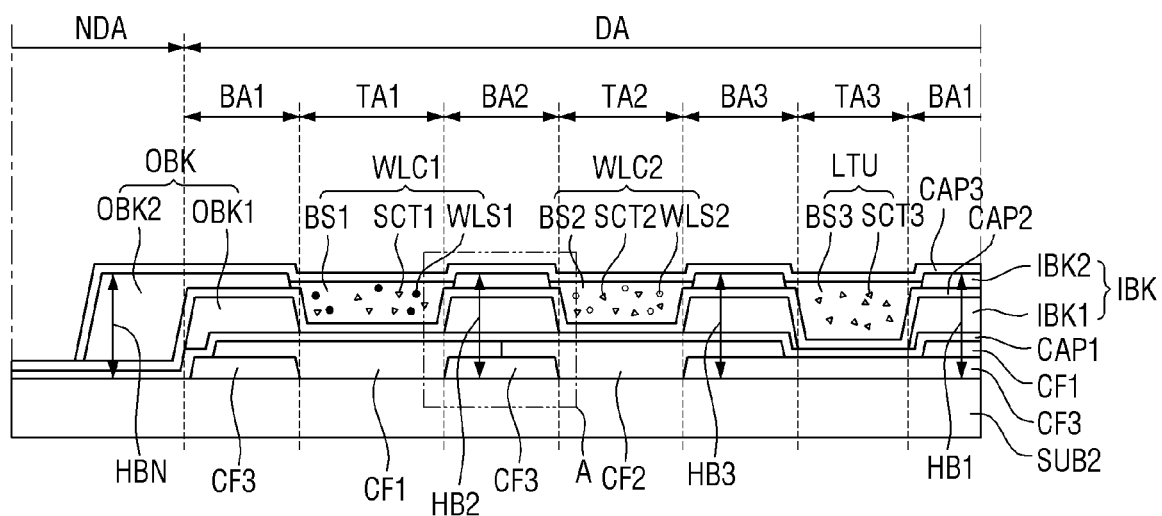
FIG. 6 is a cross-sectional view illustrating the color conversion substrate of FIG. 4.
Figure 7:
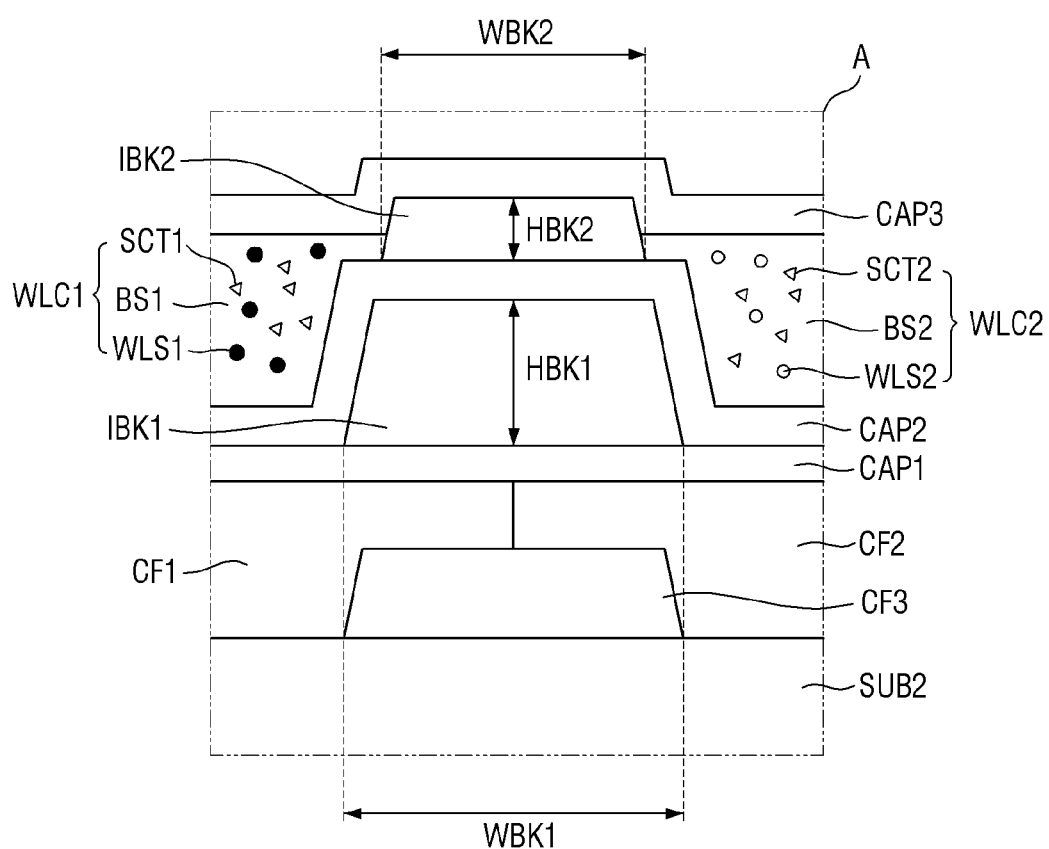
FIG. 7 is a cross-sectional view illustrating, on an enlarged scale, part A of FIG. 6.

FIG. 5 is a cross-sectional view taken along line II-IF of FIGS. 3 and 4, FIG. 6 is a cross-sectional view illustrating the color conversion substrate of FIG. 4, and FIG. 7 is a cross-sectional view illustrating, on an enlarged scale, part A of FIG. 6.

With reference to FIGS. 5 to 7, the display area DA of the display substrate 100 may include first, second, and third light emitting areas LA1, LA2, and LA3. Each of the first, second, and third light emitting areas LA1, LA2, and LA3 may be an area through which the light emitted by the light emitting element is radiated outside the display substrate 100.

The display substrate 100 may include a first base member SUB1, a buffer layer BF, a thin film transistor layer TFTL, a light emitting element EL, and an encapsulation layer TFE.

The first base member SUB1 may be a base substrate and may be made of an insulating material such as a polymer resin. For example, the first base member SUB1 may be a rigid substrate. For example, the first base member SUB1 may be a flexible substrate that can be bent, folded, and rolled. When the first base member SUB1 is a flexible substrate, the first base member SUB1 may be made of polyamide (PI), but exemplary embodiments are not limited thereto.

The buffer layer BF may be disposed on the first base member SUB1. The buffer layer BF may be made in the form of an inorganic film that is capable of protecting against air or water infiltration. For example, the buffer layer BF may include a plurality of inorganic films laminated alternately. The buffer layer BF may be made of a multi-layered film formed by alternately laminating at least one of inorganic layers such as silicon nitride layers, silicon oxynitride layers, silicon oxide layers, titanium oxide layers, and aluminum oxide layers, but exemplary embodiments are not limited thereto.

The thin film transistor layer TFTL may include thin film transistors TFT, a gate insulating layer GI, an interlayer dielectric layer ILD, a protection layer PAS, and a planarization layer OC.

The thin film transistors TFT may be arranged on the buffer layer BF to form respective pixel circuits. For example, the thin film transistors TFT may each be a switching transistor or a driving transistor of each pixel circuit. The thin film transistor TFT may include a semiconductor layer ACT, a gate electrode GE, a source electrode SE, and a drain electrode DE.

The semiconductor layer ACT may be formed on the buffer layer BF. The semiconductor layer ACT may overlap the gate electrode GE, the source electrode SE, and the drain electrode DE. The semiconductor layer ACT may directly contact the source electrode SE and the drain electrode DE and face the gate electrode GE through the gate insulating layer GI.

The gate electrode GE may be arranged on the upper surface of the gate insulating layer GI. The gate electrode may overlap the semiconductor layer ACT through the gate insulating layer GI.

The source electrode SE and the drain electrode DE may be arranged on the interlayer dielectric layer ILD and spaced apart from each other by an interval. The source electrode SE may contact an end of the semiconductor layer ACT via a contact hole formed in the gate insulating layer GI and the interlayer dielectric layer ILD. The drain electrode DE may contact the other end of the semiconductor layer ACT via another contact hole formed in the gate insulating layer GI and the interlayer dielectric layer ILD. The drain electrode DE may contact the first electrode AND of the light emitting element EL via a contact hole formed in the protection layer PAS and the planarization layer OC.

The gate insulating layer GI may be formed on the upper surface of the semiconductor layer ACT. For example, the gate insulating layer GI may be arranged on the upper surface of the semiconductor layer ACT and the buffer layer BF to insulate the gate electrode GE from the semiconductor layer ACT. The gate insulating layer GI may include contact holes through which the source electrode SE penetrates and contact holes through which the drain electrode DE penetrates.

The interlayer dielectric layer ILD may be arranged on the upper surface of the gate electrode GE. For example, the interlayer dielectric layer ILD may include contact holes through which the source electrode SE penetrates and contact holes through which the drain electrode DE penetrates. Here, the contact holes of the interlayer dielectric layer ILD may be connected to the contact holes of the gate insulating layer GI.

The protection layer PAS may be arranged on the upper surface of the thin film transistor TFT to protect the thin film transistor TFT. For example, the protection layer PAS may include contact holes through which the first electrode AND penetrates.

The planarization layer OC may be arranged on the upper surface of the protection layer PAS to planarize the upper surface of the thin film transistor TFT. For example, the planarization layer OC may include contact holes through which the first electrode AND penetrates. Here, the contact hole of the planarization layer OC may be connected to the contact hole of the protection layer PAS.

The light emitting element EL may be arranged on a first transistor T1. The light emitting element EL may include a first electrode AND, a light emitting layer E, and a second electrode CAT.

The first electrode AND may be arranged on the upper surface of the planarization layer OC. For example, the first electrode AND may overlap one of the first, second, and third light emitting areas LA1, LA2, and LA3 defined by the pixel definition layer PDL. The first electrode AND may be connected to the drain electrode DE of the thin film transistor TFT.

The light emitting layer E may be arranged on the upper surface of the first electrode AND. The light emitting layer E may include a hole injection layer, a hole transport layer, a light receiving layer, an electron blocking layer, an electron transport layer, and an electron injection layer. For example, the light emitting layer E may be formed as an organic light emitting layer made of an organic material, but exemplary embodiments are not limited thereto. When the light emitting layer E is formed as the organic light emitting layer, the thin film transistor TFT applies a predetermined voltage to the first electrode AND of the light emitting element EL. When the second electrode CAT of the light emitting element EL receives a common voltage or a cathode voltage, the holes and electrons may move to the organic light emitting layer E through the hole transport layer and the electron transport layer and may be combined to produce light to be emitted by the organic light emitting layer E.

The second electrode CAT may be arranged on the upper surface of the light emitting layer E. For example, the second electrode CAT may be made in the form of an electrode common to all of the pixels rather than specific to each of the pixels. In FIG. 5, the second electrode CAT may be arranged on the light emitting layer E inside the first, second, and third light emitting areas LA1, LA2, and LA3 and on the pixel definition layer PDL outside the first, second, and third light emitting areas LA1, LA2, and LA3.

The pixel definition layer PDL may define the first, second, and third light emitting areas LA1, LA2, and LA3. The first electrodes AND of multiple light emitting elements EL may be electrically insulated from each other by the pixel definition layer PDL.

The encapsulation layer TFE may be arranged on the second electrode CAT to cover the multiple light emitting elements EL. The encapsulation layer TFE may protect the multiple light emitting elements EL from air or water infiltration.

The color conversion substrate 300 may be disposed above the display substrate 100. The color conversion substrate 300 may include the first, second, and third transparent areas TA1, TA2, and TA3 and the first, second, and third light blocking areas BA1, BA2, and BA3. The first, second, and third transparent areas TA1, TA2, and TA3 may respectively correspond to the first, second, and third light emitting areas LA1, LA2, and LA3 of the display substrate 100. The first, second, and third light blocking areas BA1, BA2, and BA3 may be arranged at one side of the first, second, and third transparent areas TA1, TA2, and TA3 to prevent the colored lights emitted through the first, second, and third transparent areas TA1, TA2, and TA3 from being mixed with one another.

The color conversion substrate 300 may include a second base member SUB2, first, second, and third color filters CF1, CF2, and CF3, a first capping layer CAP1, an outer light blocking member OBK, an inner light blocking member IBK, a second capping layer CAP2, first and second wavelength conversion units WLC1 and WLC2, a light transmission unit LTU, and a third capping layer CAP3.

The second base member SUB2 may be a base substrate and may be made of an insulating material such as a polymer resin. The second base member SUB2 may be made of a light-permeable material to pass the light emitted from the first, second, and third transparent areas TA1, TA2, and TA3 therethrough. For example, the second base member SUB2 may be a rigid substrate. Alternatively, the second base member SUB2 may be a flexible substrate that can be bent, folded, and rolled. When the second base member SUB2 is a flexible substrate, the second base member SUB2 may be made of polyamide (PI), but exemplary embodiments are not limited thereto.

For example, a separate buffer layer may be arranged on the second base member SUB2 to prevent impurity infiltration on one surface of the second base member SUB2. In this case, the first, second, and third color filters CF1, CF2, and CF3 may directly contact the buffer layer.

The first color filter CF1 may be arranged on the second base member SUB2 to overlap the first transparent area TA1. The first color filter CF1 may selectively pass a first color light (e.g., red light) therethrough and filter out or absorb a second color light (e.g., green light) and a third color light (e.g., blue light). For example, the first color filter CF1 may be a red color filter and contain a red colorant. The red colorant may be a red dye or a red pigment.

The second color filter CF2 may be arranged on the second base member SUB2 to overlap the second transparent area TA2. The second color filter CF2 may selectively pass the second color light (e.g., green light) therethrough and filter out or absorb the first color light (e.g., red light) and the third color light (e.g., blue light). For example, the second color filter CF2 may be a green color filter and contain a green colorant. The green colorant may be a green dye or a green pigment.

The third color filter CF3 may be arranged on the second base member SUB2 to overlap the third transparent area TA3. The third color filter CF3 may also overlap the first, second, and third light blocking areas BA1, BA2, and BA3. The third color filter CF3 may selectively pass the third color light (e.g., blue light) therethrough and filter out or absorb the first color light (e.g., red light) and the second color light (e.g., green light). For example, the third color filter CF3 may be a blue color filter and contain a blue colorant. The blue colorant may be a blue dye or a blue pigment.

In the case where the third color filter CF3 contain the blue colorant, the external light passed through the third color filter CF3 or the light reflected by the third color filter CF3 may be in the blue wavelength spectrum. The eye color sensibility per human eye-perceptive color differs according to the color of light. For example, the light in the blue wavelength spectrum may be less perceptive by a user than the light in the green and red wavelength spectra. Accordingly, the light reflected from the third color filter CF3 containing the blue colorant may be perceived by the user in a relatively less sensitive manner.

The first, second, and third color filters CF1, CF2, and CF3 may absorb part of the light coming from the outside of the display device 10 and passing through the color conversion substrate 300 to reduce the reflection of the external light. In other words, the first, second, and third color filters CF1, CF2, and CF3 may prevent color distortion caused by the reflection of the external light.

The first capping layer CAP1 may cover the first, second, and third color filters CF1, CF2, and CF3 in the display area DA. For example, the first capping layer CAP1 may be disposed directly on the second base member SUB2 in the non-display area NDA. For example, the first capping layer CAP1 may directly contact the first, second, and third color filters CF1, CF2, and CF3 in the first light blocking area BA1 and the first color filter CF1 in the first transparent area TA1. The first capping layer CAP1 may directly contact the first and second color filters CF1 and CF2 in the second light blocking area BA2 and the second color filter CF2 in the second transparent area TA2. The first capping layer CAP1 may directly contact the second and third color filters CF2 and CF3 in the third light blocking area BA3 and the third color filter CF3 in the third transparent area TA3.

The first capping layer CAP1 may prevent infiltration of impurities such as water and air from the outside, which protects the first, second, and third color filters CF1, CF2, and CF3 from being damaged or contaminated. The first capping layer CAP1 may prevent the colorant contained in the first, second, and third color filters CF1, CF2, and CF3 from being diffused into the first and second wavelength conversion units WLC1 and WLC2 or the light transmission unit LTU.

The first capping layer CAP1 may contain inorganic materials. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

A plurality of light blocking members BK may be disposed above the first, second, and third color filters CF1, CF2, and CF3 so as to respectively overlap a plurality of light blocking areas. The plurality of light block members BK may block light penetration. For example, the plurality of light blocking members BK may prevent light infiltration and color mixture among the first, second, and third transparent areas TA1, TA2, and TA3 such that color reproducibility is improved. The plurality of light blocking members BK may be arranged in the form of a grid surrounding the first, second, and third transparent areas TA1, TA2, and TA3 in a plan view.

The plurality of light blocking members BK may include outer light blocking members OBK and inner light blocking members IBK. The outer light blocking members OBK may overlap an outer light blocking area formed around a plurality of transparent areas. The outer light blocking members OBK may be interposed between the display area DA and the non-display area NDA to surround the display area DA. As shown in FIGS. 5 and 6, the outer light blocking members OBK may overlap the first light blocking area BA1 as the outermost one of the plurality of light blocking areas.

The inner light blocking members IBK may be arranged inside the outer light blocking members OBK and overlap inner block areas arranged between the plurality of transparent areas. The inner light blocking members IBK may be arranged in the display area DA. As shown in FIGS. 5 and 6, the inner light blocking members IBK may overlap the first, second, and third light blocking areas BA1, BA2, and BA3 except for the first light blocking area BA1 as the outermost one of the plurality of light blocking areas.

An outer light blocking member OBK may include first and second outer light blocking members OBK1 and OBK2. An inner light blocking member IBK may include first and second inner light blocking members IBK1 and IBK2.

The first outer light blocking member OBK1 and the first inner light blocking member IBK1 may be arranged above the first, second, and third color filters CF1, CF2, and CF3. For example, the first outer light blocking member OBK1 and the first inner light blocking member IBK1 may be disposed directly on the first capping layer CAP1 formed on the first, second, and third color filters CF1, CF2, and CF3.

The first outer light blocking member OBK1 and the first inner light blocking member IBK1 may include an organic light blocking material. For example, the first outer light blocking member OBK1 and the first inner light blocking member IBK1 may contain a black organic material. The first outer light blocking member OBK1 and the first inner light blocking member IBK1 may be formed by a process of coating and exposing an organic light blocking material.

The second capping layer CAP2 may cover the first capping layer CAP1 in the non-display area NDA and the first, second, and third transparent areas TA1, TA2, and TA3, and may cover the first outer light blocking member OBK1 and the first inner light blocking member IBK1 in the first, second, and third light blocking areas BA1, BA2, and BA3. For example, the second capping layer CAP2 may directly contact the first outer light blocking member OBK1 in the first light blocking area BA1 and may directly contact the first inner light blocking member IBK1 in the first, second, and third light blocking areas BA1, BA2, and BA3 except for the first light blocking area BA1 as the outermost one of the plurality of light blocking areas.

The second capping layer CAP2 may be additionally formed on the first capping layer CAP1 for double protection against damage and contamination to the first, second, and third color filters CF1, CF2, and CF3. The second capping layer CAP2 may prevent the colorant contained in the first, second, and third color filters CF1, CF2, and CF3 from being diffused into the first and second wavelength conversion units WLC1 and WLC2 or the light transmission unit LTU.

The second capping layer CAP2 may contain inorganic materials. The second capping layer CAP2 may be formed of the materials identical to or different from the materials of the first capping layer CAP1. For example, the second capping layer CAP2 may contain at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The second outer light blocking member OBK2 may include one portion disposed above the first outer light blocking member OBK1 and another portion disposed above the second base member SUB2 to overlap the non-display area NDA. For example, the second outer light blocking member OBK2 may be arranged such that the one portion thereof is disposed directly on the second capping layer CAP2 to overlap the first outer light blocking member OBK1 and the another portion thereof is disposed directly on the second capping layer CAP2 to overlap the non-display area NDA. The another portion of the second outer light blocking member OBK2 may not overlap the third color filter CF3.

The second outer light blocking member OBK2 may be disposed to cover a top surface and an outer side surface of the first outer light blocking member OBK1. For example, the second capping layer CAP2 may cover the top surface and the outer side surface of the first outer light blocking member OBK1. The second outer light blocking member OBK2 may be disposed directly on the second capping layer CAP2 that covers the top surface and the outer side surface of the first light blocking member OBK1.

The first and second outer light blocking members OBK1 and OBK2 have width in the first direction (X-axis direction). The width of the second outer light blocking member OBK2 may be wider than that of the first outer light blocking member OBK1 in a plan view. For example, the second outer light blocking member OBK2 may be arranged so as to be disposed, partially, above the first outer light blocking member OBK1 and extended, partially, in the direction from the first outer light blocking member OBK1 to the non-display area NDA. The width of the outer light blocking member OBK may also be wider than that of the inner light blocking member IBK in a plan view. Accordingly, the display device 10 may be fabricated such that the height HBN of the outer light blocking member OBK from the second base member SUB2 is substantially equal to each of the heights HB1, HB2, and HB3 of the inner light blocking members IBK from the second base member SUB2.

The second inner light blocking member IBK2 may be disposed above the first light blocking member IBK1. For example, the second capping layer CAP2 may cover the top surface and the outer side surface of the first inner light blocking member IBK1, and the second inner light blocking member IBK2 may be disposed directly on the second capping layer CAP2 covering the top side of the first inner light blocking member IBK1.

As shown in FIG. 7, the width BWK2 of the second inner light blocking member IBK2 may be narrower, in a plan view, than the width WBK1 of the first inner blocking member IBK1. Each of the first and second inner light blocking members IBK1 and IBK2 have a base side and an upper side, which is closer to the second base member SUB2 than the base side. For example, the base sides of the first and second inner light blocking members IBK1 and IBK2 are smaller sizes than the upper sides thereof, respectively. The size of the base side of the second inner light blocking member IBK2 may be smaller than that of the upper side of the first inner light blocking member IBK1. Accordingly, the width of the inner light blocking member MK in a plan view becomes narrower in a direction away from the second base member SUB2. For example, the height HBK1 of the first inner light blocking member IBK1 may be higher than the height HBK2 of the second inner light blocking member IBK2, but exemplary embodiments are not limited thereto.

The second outer light blocking member OBK2 and the second inner light blocking member IBK2 may contain an organic light blocking material and a liquid repellent component. Here, the liquid repellent component may be composed of fluorine-containing monomer or fluorine-containing polymer and, in detail, may include fluorine-containing aliphatic polycarbonate. For example, the second outer light blocking member OBK2 and the second inner light blocking member IBK2 may be composed of a black organic material containing the liquid repellent component. The second outer light blocking member OBK2 and the second inner blight blocking member IBK2 may be formed by a process of coating and exposing an organic light blocking material containing the liquid repellent component.

The second outer light blocking member OBK2 and the second inner light blocking member IBK2 containing the liquid repellent component may separate the first and second wavelength conversion units WLC1 and WLC2 and the light transmission unit LTU in the corresponding transparent areas from each other. For example, when the first and second wavelength conversion unit WLC1 and WLC2 and the light transmission unit LTU are formed in an inkjet manner, the ink compositions may slide on the surfaces of the second outer light blocking member OBK2 and the second inner light blocking member IBK2. In this case, the second outer light blocking member OBK2 and the second inner light blocking member IBK2 containing the liquid repellent component may allow the ink composition to slide down to the corresponding transparent areas. As a consequence, the second outer light blocking member OBK2 and the second inner light blocking member IBK2 may prevent the ink compositions from being mixed with one another.

In FIG. 6, the height HBN of the external light blocking member OBK from the second base member SUB2 may be substantially equal to the heights HB1, HB2, and HB3 of the inner light blocking members IBK from the second base member SUB2. For example, the height HBN of the external light blocking member OBK from the second base member SUB2 may be substantially equal, within an error margin of about 3%, to each of the heights H1, H2, and H3 of the inner light blocking members IBK from the second base member SUB2 in the first, second, and third light blocking areas BA1, BA2, and BA3.

This makes it possible that the thicknesses of the first and second wavelength conversion units WLC1 and WLC2 and the light transmission unit LTU remain substantially equal to one another, and the thickness of the filler material 700 between the display substrate 100 and the color conversion substrate 300 remains substantially constant/uniform even during the process of laminating the display substrate 100 and the color conversion substrate 300 for fabricating the display device 10. As a consequence, it may be possible to prevent poor lamination and stains.

The first wavelength conversion unit WLC1 may be disposed above the first color filter CF1 to overlap the first transparent area TA1. The first wavelength conversion unit WLC1 may be surrounded by the outer light blocking member OBK or the inner light blocking member IBK. The first wavelength conversion unit WLC1 may include a first based resin BS1, a first scatterer SCT1, and a first wavelength shifter WLS1.

The first base resin BS1 may contain a material having a relatively high light transmissivity. The first base resin BS1 may be composed of a transparent organic material. For example, the first base resin BS1 may contain at least one organic material of an epoxy resin, an acrylic resin, a cardo resin, or an imide resin.

The first scatterer SCT1 may have a refractive index different from that of the first base resin BS1 and may form an optical interface with the first base resin BS1. For example, the first scatterer SCT1 may contain light scattering particles for scattering at least part of the transmitted light. For example, the first scatterer SCT1 may contain a metallic oxide such as titanium oxide ($TiO_2$), zirconium oxide ($ZrO_2$), aluminum oxide ($AL_2O_3$), indium oxide ($In_2O_3$), zinc oxide (ZnO), or tin oxide ($SnO_2$), or may contain organic particles such as acrylic resin and urethane resin. The first scatterer SCT1 may scatter light in random directions regardless of the incidence direction of the incident light without any substantial change of the peak wavelength of the incident light.

The first wavelength shifter WLS1 may change or shift the wavelength of the incident light to a first peak wavelength. For example, the first wavelength shifter WLS1 may convert the wavelength of the blue light emitted from the display substrate 100 to a single peak wavelength in the range from about 610 nm to about 650 nm to produce a red light.

For example, the first wavelength shifter WLS1 may be a quantum dot, a quantum rod, or a fluorescent substance. The quantum dot may be a particulate material that emits light of a specific color when an electron transitions from a conduction band to a valence band.

For example, the quantum dot may be a semiconductor nanocrystal material. The quantum dot has a band gap varying according to its construction and size so as to absorb light and then proceed to emit the light having a unique wavelength. Examples of the semiconductor nanocrystal of the quantum dot may include a Group IV nanocrystal, a Group II-VI compound nanocrystal, a Group III-V compound nanocrystal, a Group IV-VI compound nanocrystal, and a combination thereof.

The Group II-VI compound may be selected from a group including two-element compounds selected from a group including CdSe, CdTe, ZnS, ZnSe, ZnTe, ZnO, HgS, HgSe, HgTe, MgSe, MgS, and their mixtures; three-element compounds selected from a group including InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and their mixtures; and four-element compounds selected from a group including HgZnTeS, CdZnSeS, CdZnSeTe, CdZnSTe, CdHgSeS, CdHgSeTe, CdHgSTe, HgZnSeS, HgZnSeTe, HgZnSTe, and their mixtures.

The Group III-V compound may be selected from a group including two-element compounds selected from a group including GaN, GaP, GaAs, GaSb, AlN, AlP, AlAs, AlSb, InN, InP, InAs, InSb, and their mixtures; three-element compounds selected from a group including GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and their mixtures; and four-element compounds selected from a group including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and their mixtures.

The Group IV-VI compound may be selected from a group including two-element compounds selected from a group including SnS, SnSe, SnTe, PbS, PbSe, PbTe, and their mixtures; three-element compounds selected from a group including SnSeS, SnSeTe, SnSTe, PbSeS, PbSeTe, PbSTe, SnPbS, SnPbSe, SnPbTe, and their mixtures; and four-element compounds selected from a group including SnPbSSe, SnPbSeTe, SnPbSTe, and their mixtures. The Group IV element may be selected from a group including Si, Ge, and their mixtures. The Group IV compound may a two-element compound selected from a group including SiC, SiGe, and their mixtures.

For example, the two-element compound, the three-element compound, or the four-element compound may exist in a uniform concentration within a particle or in partially different concentrations within the same particle.

For example, the quantum dot may have a core-shell structure including a core containing the aforementioned nanocrystal and a shell surrounding the core. The shell of the quantum dot may serve as a protection layer for maintaining the semiconductor characteristics by preventing chemical denaturation of the core and as a charging layer to give the quantum dot its electrophoretic properties. The shell may be composed of a single layer or multiple layers. The interface between the core and the shell may have a concentration gradient in which the concentration of elements present in the shell decreases as getting closer to the center. The shell of the quantum dot may be composed of a metallic or nonmetallic oxide, a semiconductor compound, or a combination thereof.

The metallic or nonmetallic oxide may include a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO, or a three-element compound such as $MgAl_2O_4$, $CoFe_2O_4$, $NiFe_2O_4$ and $CoMn_2O_4$, but exemplary embodiments are not limited thereto.

For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but exemplary embodiments are not limited thereto.

The light being emitted by the first wavelength shifter WLS1 may have a full width of half maximum (FWHM) of the emission wavelength spectrum, which is equal to or less than about 45 nm, about 40 nm, or about 30 nm, thereby further improving the purity and reproducibility of colors produced by the display device 10. The light being emitted by the first wavelength shifter WLS1 may be emitted in various directions regardless of the incidence direction of the incident light. This makes possible to improve lateral visibility of the red color displayed in the first transparent area TA1.

Part of the blue light emitted from the display substrate 100 may pass through the first wavelength conversion unit WLC1 without being converted to a red light by the first wavelength shifter WLS1. The blue light emitted from the display substrate 100 and not converted by the first wavelength conversion unit WLC1 may be filtered out by the first color filter CF1. The red light produced by the first wavelength conversion unit WLC1 for converting the blue light emitted from the display substrate 100 may pass through the first color filter CF1 to be emitted to the outside. Accordingly, the red light is emitted through the first transparent area TA1.

The second wavelength conversion unit WLC2 may be disposed above the second color filter CF2 to overlap the second transparent area TA2. The second wavelength conversion unit WLC2 may be surrounded by the inner light blocking member IBK. The second wavelength conversion unit WLC2 may include a second base resin BS2, a second scatterer SCT2, and a second wavelength shifter WLS2.

The second base resin BS2 may contain a material having a relatively high light transmissivity. The second base resin BS2 may be composed of a transparent organic material. For example, the second base resin BS2 may be composed of the same material as the materials, of which the first base resin B S1 is formed.

The second scatterer SCT2 may have a refractive index different from that of the second base resin BS2 and form an optical interface with the second base resin BS2. For example, the second scatterer SCT2 may contain light scattering particles scattering at least part of the transmitted light. For example, the second scatterer SCT2 may be composed of the same material as the materials, of which the first scatterer SCT1 is formed. The second scatterer SCT2 may scatter the light in random directions regardless of the incidence direction of the incident light without any substantial change of the peak wavelength of the incident light.

The second wavelength shifter WLS2 may change or shift the wavelength of the incident light to a second peak wavelength that differs from the first peak wavelength shifted out by the first wavelength shifter WLS1. For example, the second wavelength shifter WLS2 may convert the wavelength of the blue light emitted from the display substrate 100 to a single peak wavelength in the range from about 510 nm to about 550 nm to produce a green light.

For example, the second wavelength shifter WLS2 may be a quantum dot, a quantum rod, or a fluorescent substance. The second wavelength shifter WLS2 may contain the materials identical in purpose with the materials enumerated in association with the first wavelength shifter WLS1. The second wavelength shifter WLS2 may be composed of a quantum dot, a quantum rod, or a fluorescent substance to have a wavelength conversion range different from that of the first wavelength shifter WLS1.

The light transmission unit LTU may be disposed above the third color filter CF3 to overlap the third transparent area TA3. The light transmission unit LTU may be surrounded by the outer light blocking member OBK or the inner light blocking member IBK. The light transmission unit LTU may pass the incident light therethrough with maintaining the peak wavelength of the light. The light transmission unit LTU may include a third base resin BS3 and a third scatterer SCT3.

The third base resin BS3 may contain a material having a relatively high light transmissivity. The third base resin BS3 may be composed of a transparent organic material. For example, the third base resin BS3 may be composed of the same material as the first base resin BS1 or the second base resin BS2 or the materials exemplified in association with the first base resin BS1 or the second base resin BS2.

The third scatterer SCT3 may have a refractive index different from that of the third base resin BS3 and form an optical interface with the third base resin BS3. For example, the third scatterer SCT3 may contain light scattering particles scattering at least part of the transmitted light. For example, the third scatterer SCT3 may be composed of the same material as the first scatterer SCT1 or the second scatterer SCT2 or the materials exemplified in association with the first scatterer SCT1 or the second scatterer SCT2. The third scatterer SCT3 may scatter the light in random directions regardless of the incidence direction of the incident light without any substantial change of the peak wavelength of the incident light.

The third capping layer CAP3 may cover the first and second wavelength conversion units WLC1 and WLC2, the light transmission unit LTU, the outer light blocking member OBK, and the inner light blocking member IBK. For example, the third capping layer CAP3 may seal the first and second wavelength conversion units WLC1 and WLC2 and the light transmission unit LTU to protect the first and second wavelength conversion units WLC1 and WLC2 and the light transmission unit LTU from damage or contamination. The third capping layer CAP3 may be composed of the same material as the materials, of which the first capping layer CAP1 or the second capping layer CAP2 is formed.

FIGS. 8 to 12 are cross-sectional views illustrating a process of fabricating the display device of FIG. 1.

Figure 8:
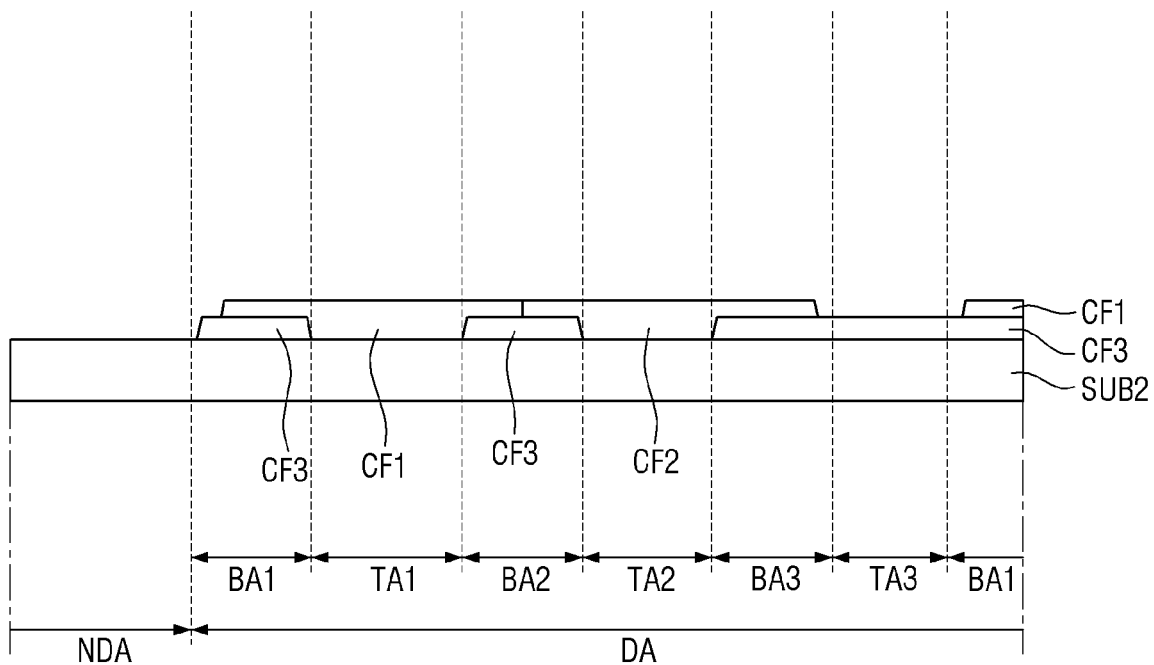
FIGS. 8, 9, 10, 11, and 12 are cross-sectional views illustrating a process of fabricating the display device of FIG. 1.

With reference to FIG. 8, the first, second, and third color filters CF1, CF2, and CF3 may be formed on a surface of the second base member SUB2. Each of the first, second, and third color filters CF1, CF2, and CF3 may be formed by coating the surface of the second base member SUB2 with a photosensitive organic material containing a colorant of a specific color and by exposing and developing the photosensitive organic material. For example, the first color filter CF1 may be formed with a photosensitive material containing a red colorant, the second color filter CF2 may be formed with a photosensitive material containing a green colorant, and the third color filter CF3 may be formed with a photosensitive material containing a blue colorant.

For example, the first, second, and third color filters CF1, CF2, and CF3 may arranged to overlap one another in the first, second, and third light blocking areas BA1, BA2, and BA3. Alternatively, the first, second, and third color filters CF1, CF2, and CF3 may be arranged to be separated from one another in the first, second, and third light blocking areas BA1, BA2, and BA3.

Figure 9:
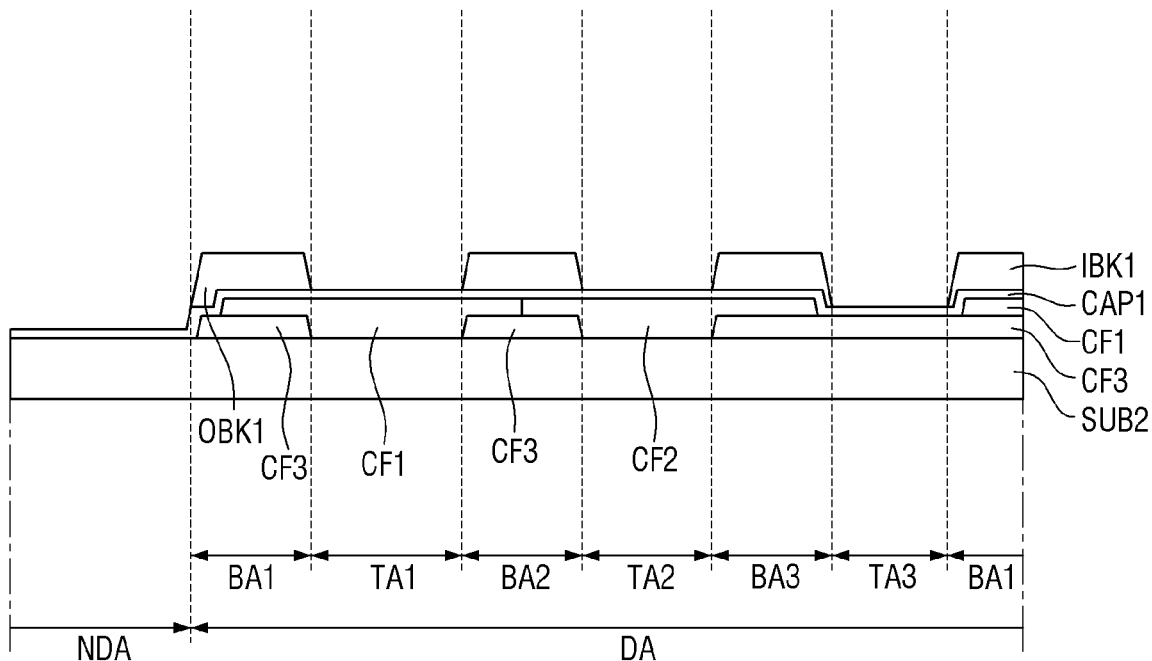

With reference to FIG. 9, the first capping layer CAP1 may be formed on the first, second, and third color filters CF1, CF2, and CF3 in the display area DA and on the base member SUB2 in the non-display area NDA.

The first outer light blocking member OBK1 may be formed on the first capping layer CAP1 to overlap the first light blocking area BA1 as the outermost one of the plurality of light blocking areas. The first inner light blocking member IBK1 may be formed on the first capping layer CAP1 to overlap the first, second, and third light blocking areas BA1, BA2, and BA3 except for the first light blocking area BA1 as the outermost one of the plurality of light blocking areas.

Figure 10:
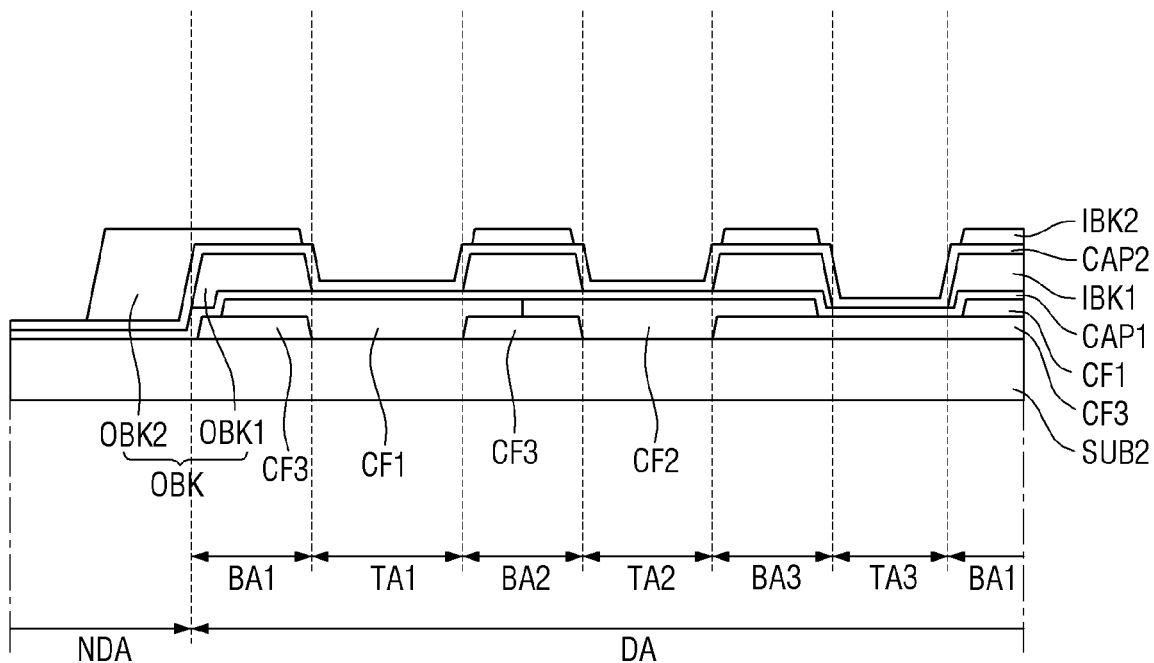

With reference to FIG. 10, the second capping layer CAP2 may be formed on the first capping layer CAP1 in the first, second, and third transparent areas TA1, TA2, and TA3 and the non-display area NDA, and may be formed on the first outer light blocking member OBK1 and the first inner light blocking member IBK1 in the first, second, and third light blocking areas BA1, BA2, and BA3.

The second light blocking member OBK2 may be formed on the second capping layer CAP2 to partially overlap the first light blocking member OBK1 and partially overlap the non-display area NDA.

Figure 11:
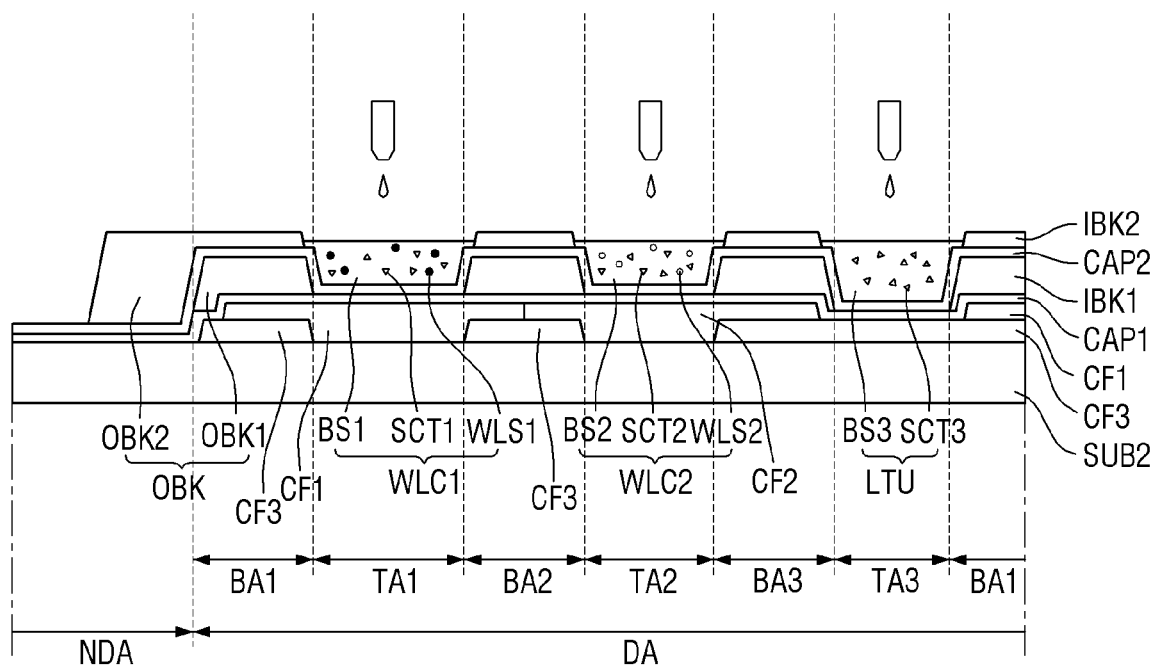

With reference to FIG. 11, the first and second wavelength conversion units WLC1 and WLC2 and the light transmission unit LTU may be formed by spraying ink in the first, second, and third transparent areas TA1, TA2, and TA3. The second external light blocking member OBK2 and the second internal light blocking member IBK2 may contain a liquid repellent component, which allow the ink composition to slide down to the corresponding transparent areas. As a consequence, the second light blocking member OBV2 and the second inner light blocking member IBK2 may prevent the ink compositions from being mixed with one another.

The first and second wavelength conversion units WLC1 and WLC2 and the light transmission unit LTU may be formed in the areas surrounded by the external light blocking member OBK or the internal light blocking member IBK.

Figure 12:
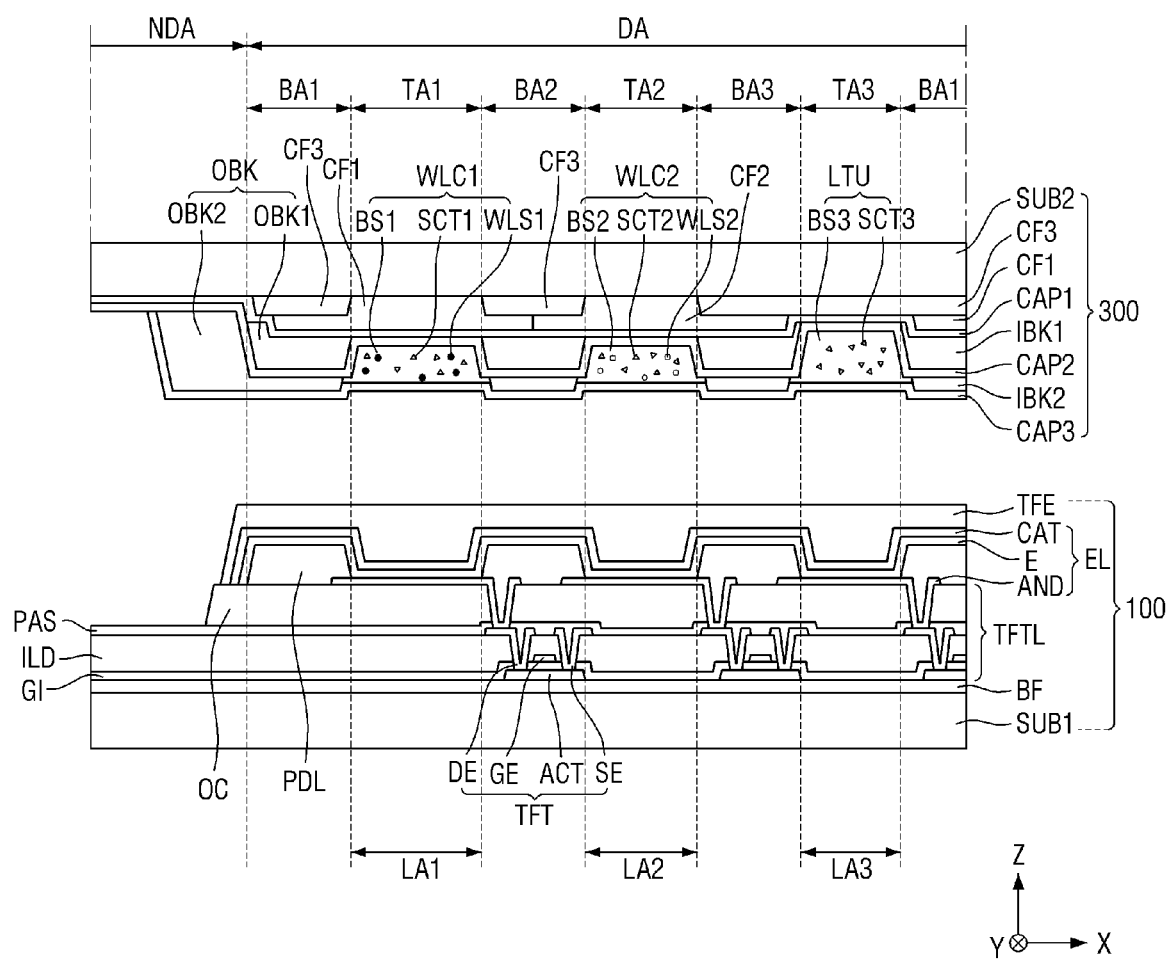

With reference to FIG. 12, the third capping layer CAP3 may be formed on the first and second wavelength conversion units WLC1 and WLC2, the light transmission unit LTU, the outer light blocking member OBK, and the inner light blocking member IBK.

The display substrate 100 and the color conversion substrate 300 may be laminated via the sealing member 500, and the filler material is filled between the display substrate 100 and the color conversion substrate 300, whereby the display device 10 can be fabricated.

Figure 13:
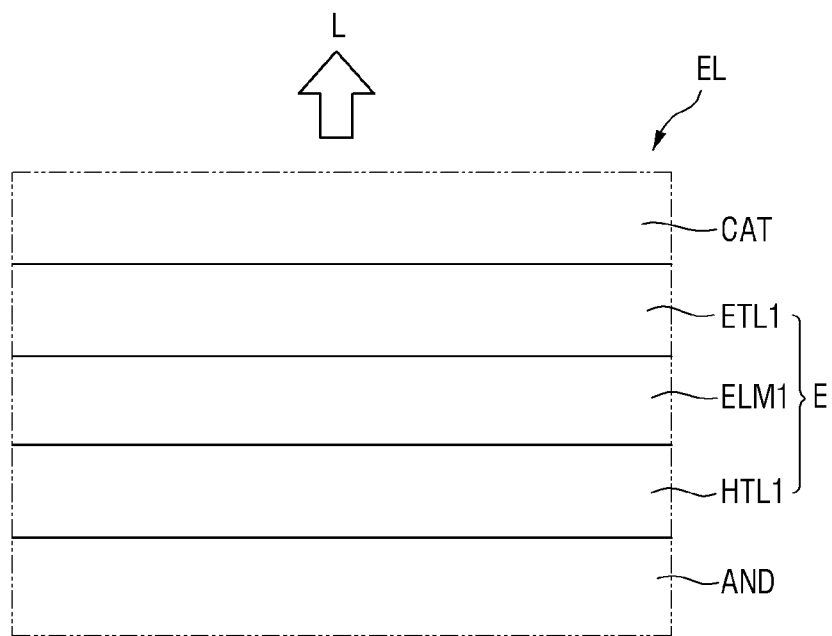
FIG. 13 is a schematic sectional view illustrating an exemplary embodiment of a light emitting element of FIG. 5.

FIG. 13 is a schematic sectional view illustrating an exemplary embodiment of a light emitting element of FIG. 5.

With reference to FIG. 13, the light emitting layer E may include a first hole transport layer HTL1 disposed on the first electrode AND, a first light emitting material layer ELM1 disposed on the first hole transport layer HTL1, and a first electron transport layer ETL1 disposed on the first light emitting material layer ELM1. In FIG. 13, the light emitting layer E may include the first light emitting material layer ELM1 as the only light emitting layer, and the first light emitting material layer ELM1 may be a blue light emitting layer. Alternatively, the layered structure of the light emitting layer E may be changed as shown in FIG. 14.

Figure 14:
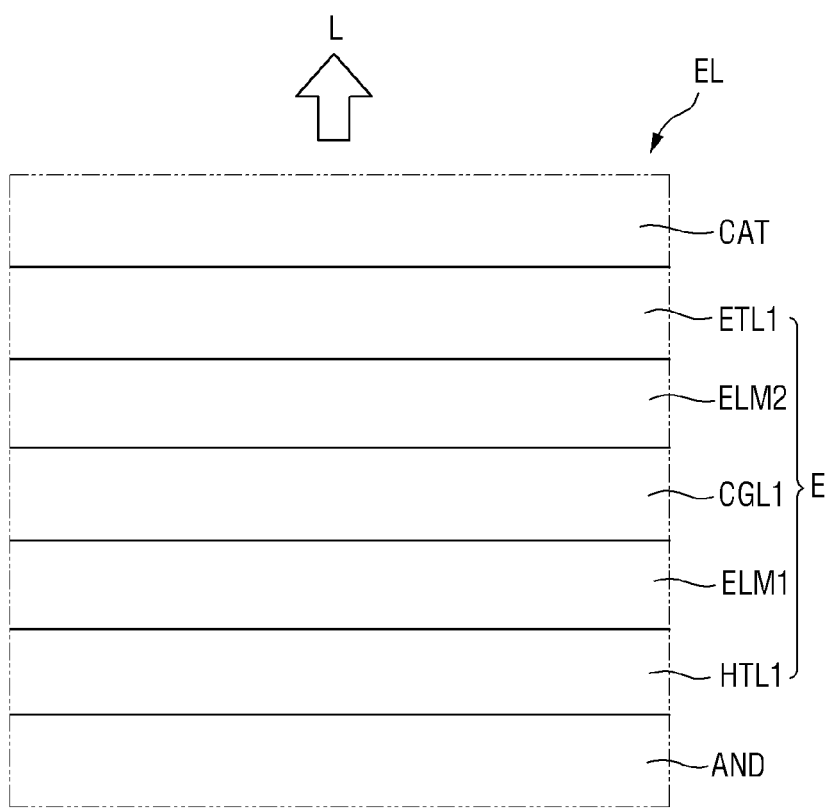
FIG. 14 a schematic sectional view illustrating another exemplary embodiment of the light emitting element of FIG. 5.

FIG. 14 a schematic sectional view illustrating another exemplary embodiment of the light emitting element shown in FIG. 5.

With reference to FIG. 14, the light emitting element E may further include a first charge generating layer CGL1 deposed on the first light emitting material layer ELM1 and a second light emitting material layer ELM2 disposed on the first charge generating layer CGL1. A first charge transport layer ETL1 may be disposed on the second light emitting layer ELM2.

The first charge generating layer CGL1 may inject charges into the adjacent light emitting layer. The first charge generating layer CGL1 may control a charge balance between the first and second light emitting material layers ELM1 and ELM2. For example, the first charge generating layer CGL1 may include an n-type charge generating layer and a p-type charge generating layer. The p-type charge generating layer may be disposed on the n-type charge generating layer.

The second light emitting material layer ELM2 may emit a blue light as the first light emitting material layer ELM1 emits, but exemplary embodiments are not limited thereto. The second light emitting material layer ELM2 may emit a blue light having a peak wavelength identical to or different from the blue light being emitted by the first light emitting material layer ELM1. Alternatively, the first and second light emitting material layers ELM1 and ELM2 may emit different color lights. In this case, the first light emitting material layer ELM1 may emit a blue light, and the second light emitting material layer ELM2 may emit a green light. By forming two light emitting layers, it may be possible to improve the light emission efficiency and device lifetime as compared with the light emitting layer E shown in FIG. 13.

Figure 15:
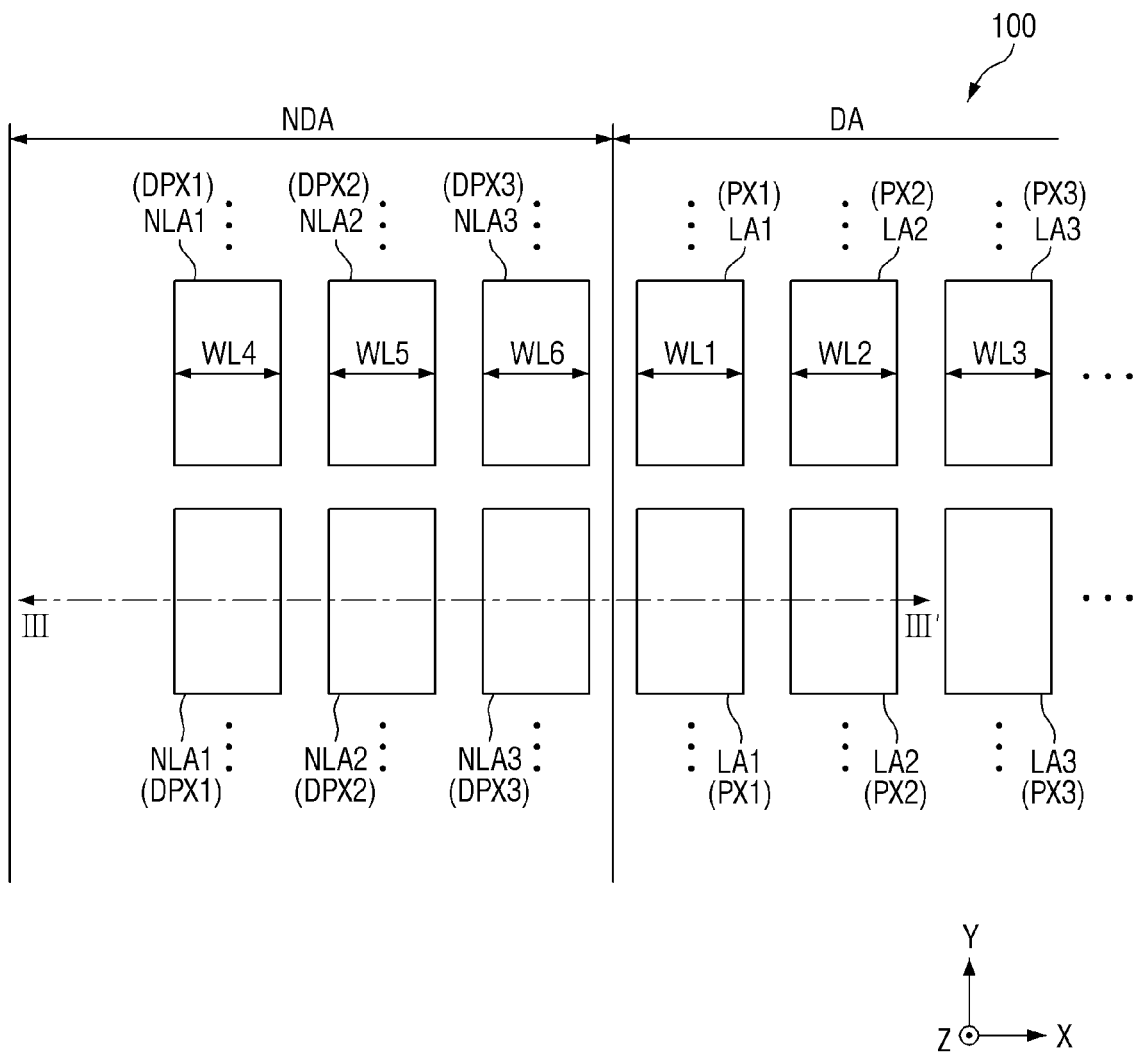
FIG. 15 is a schematic plan view illustrating another exemplary embodiment of the display substrate of FIG. 3.
Figure 16:
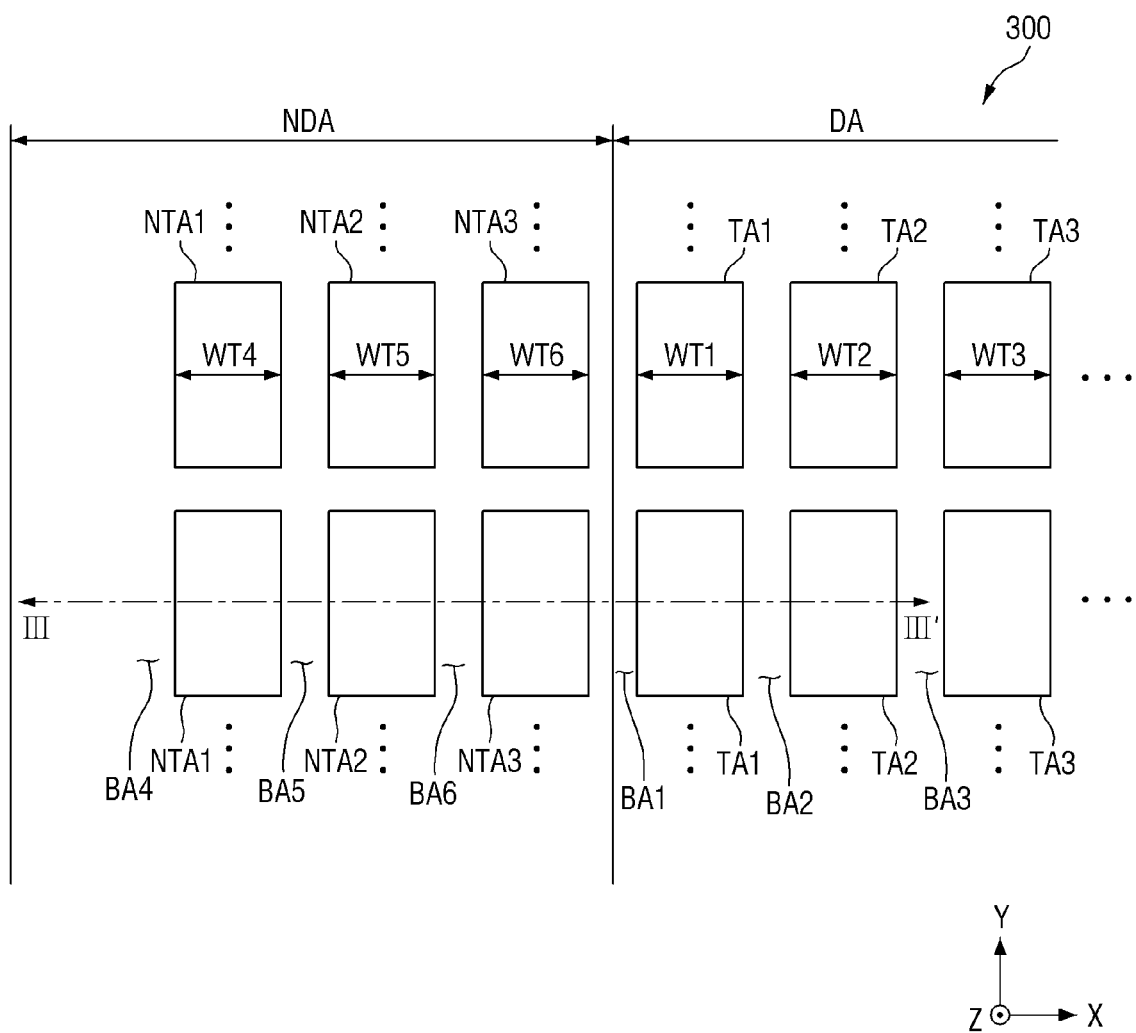
FIG. 16 is a schematic plan view illustrating another exemplary embodiment of the color conversion substrate of FIG. 4.

FIG. 15 is a schematic plan view illustrating another exemplary embodiment of the display substrate of FIG. 3, and FIG. 16 is a schematic plan view illustrating another exemplary embodiment of the color conversion substrate of FIG. 4. FIGS. 15 and 16 respectively show a configuration of the display substrate further including non-light emitting areas of the dummy pixels and a configuration of the color conversion substrate further including non-transparent areas corresponding to the non-light emitting areas, and the descriptions of the components that have already been made above are recapitulated or omitted hereinbelow.

With reference to FIGS. 15 and 16, the display substrate 100 may include a plurality of pixels PX1, PX2, and PX3 arranged in the display area DA and a plurality of dummy pixels DPX1, DPX2, and DPX3 arranged in the non-display area NDA. The plurality of dummy pixels DPX1, DPX2, and DPX3 may be identical or similar to the plurality of pixels PX1, PX2, and PX3 in structure, except for being arranged in the non-display area NDA.

The plurality of pixels PX1, PX2, and PX3 arranged in the display area DA may have respective light emitting areas LA1, LA2, and LA3 being defined by a pixel definition layer to emit a light having a predetermined peak wavelength therethrough. The plurality of dummy pixels DPX1, DPX2, and DPX3 arranged in the non-display area NDA may include respective non-light emitting areas NLA1, NLA2, and NLA3 being defined by the pixel definition layer to emit a light having a predetermined peak wavelength therethrough. Here, the plurality of dummy pixels DPX1, DPX2, and DPX3 of the display substrate 100 may emit a light through the non-light emitting areas NLA1, NLA2, and NLA3, and the light emitted through the non-light emitting areas NLA1, NLA2, and NLA3 may be blocked by the not-transparent areas NTA1, NTA2, and NTA3 of the color conversion substrate 300. Accordingly, the display device 10 may display no image in the non-display area NDA.

The first, second, and third light emitting areas LA1, LA2, and LA3 may emit the light having a predetermined peak wavelength outside the display substrate 100. For example, the first, second, and third light emitting areas LA1, LA2, and LA3 may emit a blue light. The light emitted from the first, second, and third light emitting areas LA1, LA2, and LA3 may have a peak wavelength in the range from about 440 nm to about 480 nm. The first, second, and third light emitting areas LA1, LA2, and LA3 may be arranged repetitively in the first direction (X-axis direction).

The first, second, and third non-light emitting areas NLA1, NLA2, and NLA3 may emit a light having a predetermined peak wavelength outside the display substrate 100.

For example, the first, second, and third non-light emitting areas NLA1, NLA2, and NLA3 may emit the same blue light as the first, second, and third light emitting area LA1, LA2, and LA3. The light emitted from the first, second, and third non-light emitting areas NLA1, NLA2, and NLA3 may have a peak wavelength in the range of about 440 nm to about 480 nm. The first, second, and third non-light emitting areas NLA1, NLA2, and NLA3 may be arranged in the non-display area NDA formed along the outskirt surrounding the display area DA.

The first, second, and third light emitting areas LA1, LA2, and LA3 have widths WL1, WL2, and WL3 in the first direction (X-axis direction). For example, the widths WL1, WL2, and WL3 of the first, second, and third light emitting areas LA1, LA2, and LA3 and the widths WL4, WL5, and WL6 of the first, second, and third non-light emitting areas NLA1, NLA2, and NLA3 may be substantially identical to one another without being limited to the embodiment of FIG. 15.

For example, the size of each of the first, second, and third light emitting areas LA1, LA2, and LA3 may be substantially equal to that of each of the first, second, and third non-light emitting areas NLA1, NLA2, and NLA3, but exemplary embodiments are not limited thereto.

The color conversion substrate 300 may be disposed above and face the display substrate 100. The color conversion substrate 300 may include first, second, and third transparent areas TA1, TA2, and TA3, first, second, and third non-transparent areas NTA1, NTA2, and NTA3, and first to sixth light blocking areas BA1 to BA6. The first, second, and third light transparent areas TA1, TA2, and TA3 may correspond to the first, second, and third light emitting areas LA1, LA2, and LA3 of the display substrate 100. The first, second, and third non-transparent areas NTA1, NTA2, and NTA3 may correspond to the first, second, and third non-light emitting areas NLA1, NLA2, and NLA3 of the display substrate 100. The first to sixth light blocking areas BA1 to BA6 may surround the first, second, and third transparent areas TA1, TA2, and TA3 and the first, second, and third non-transparent areas NTA1, NTA2, and NTA3.

For example, the first, second, and third light blocking areas BA1, BA2, and BA3 may be arranged at one side of the first, second, and third transparent areas TA1, TA2, and TA3, respectively, to prevent the colored lights emitted through the first, second, and third transparent areas TA1, TA2, and TA3 from being mixed with one another. The fourth, fifth, and sixth light blocking areas BA4, BA5, and BA6 may be arranged at one side of the first, second, and third non-transparent areas NTA1, NTA2, and NTA3, respectively, to block the light from the display substrate 100 to the non-display area NDA.

The first and second transparent areas TA1 and TA2 may convert the peak wavelength of the light, which passes therethrough and is emitted from the light emitting areas of the display substrate 100. For example, the first transparent area TA1 may convert the peak wavelength of the light emitted from the display substrate 100 to radiate a first color light. The second transparent area TA2 may convert the peak wavelength of the light emitted from the display substrate 100 to radiate a second color light different in color from the first color light. The third transparent area TA3 may pass the light emitted from the display substrate 100 therethrough without any peak wavelength conversion (e.g., peak wavelength conversion for generating a third color light, which is the different color from the first color light and the second color light). For example, the first color light may be a red light having a peak wavelength in the range from about 610 nm to about 650 nm, the second color light may be a green light having a peak wavelength in the range from about 510 nm to about 550 nm, and the third color light may be a blue light having a peak wavelength in the range from about 440 nm to about 480 nm.

The first, second, and third non-transparent areas NTA1, NTA2, and NTA3 may block the light emitted from the non-light emitting areas NLA1, NLA2, and NLA3 of the display substrate 100. The first, second, and third non-transparent areas NTA1, NTA2, and NTA3 may block or absorb the light emitted from the display substrate 100 because the plurality of dummy pixels DPX1, DPX2, and DPX3 of the display substrate 100 are not provided for displaying any image.

The first, second, and third transparent areas TA1, TA2, and TA3 have widths WT1, WT2, and WT3 in the first direction (X-axis direction). The first, second, and third non-transparent areas NTA1, NTA2, and NTA3 have widths WT4, WT5, and WT6 in the first direction (X-axis direction). For example, the widths WT1, WT2, and WT3 of the first, second, and third transparent areas TA1, TA2, and TA3 and the widths WT4, WT5, and WT6 of the first, second, and third non-transparent areas NTA1, NTA2, and NTA3 may be substantially identical to one another, but exemplary embodiments are not limited thereto.

For example, the size of each of the first, second, and third transparent areas TA1, TA2, and TA3 may be substantially equal to that of each of the first, second, and third non-transparent areas NTA1, NTA2, and NTA3, but exemplary embodiments are not limited thereto.

Figure 17:
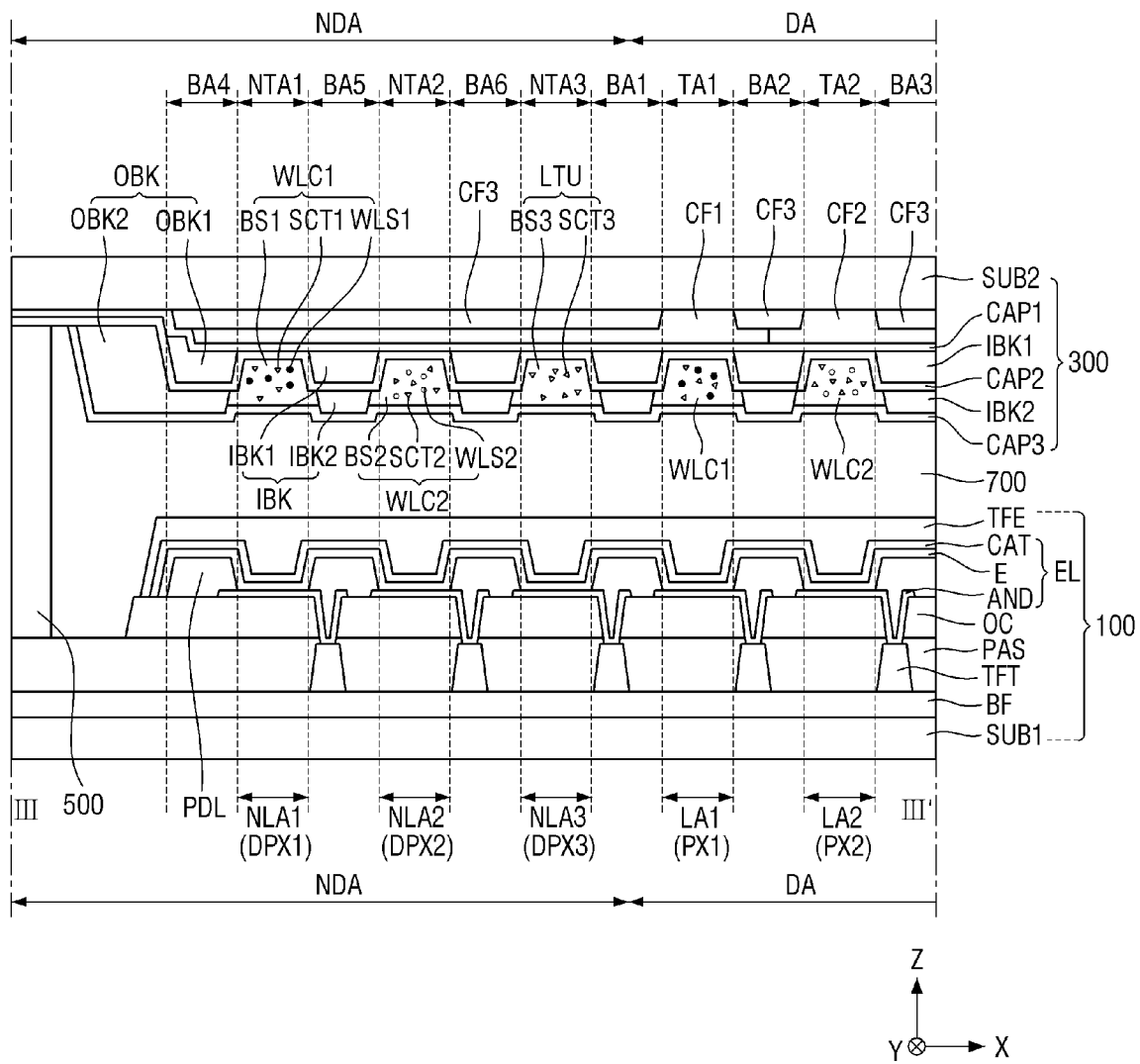
FIG. 17 is a cross-sectional view taken along line of FIGS. 15 and 16.
Figure 18:
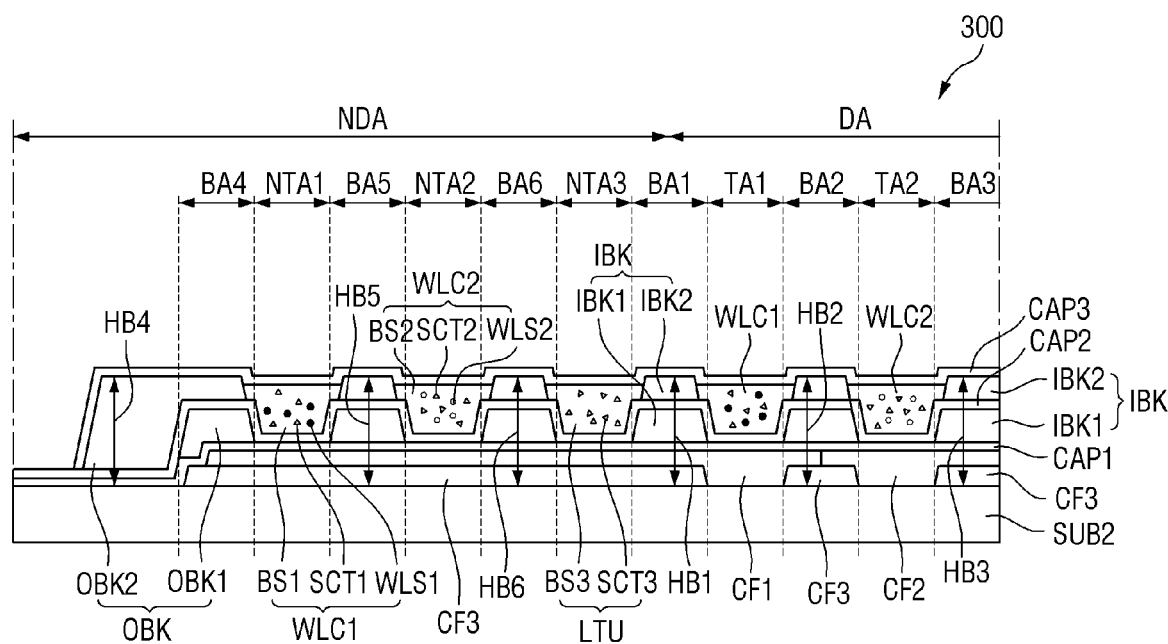
FIG. 18 is a cross-sectional view illustrating the color conversion substrate of FIG. 17.

FIG. 17 is a cross-sectional view taken along line of FIGS. 15 and 16, and FIG. 18 is a cross-sectional view illustrating the color conversion substrate of FIG. 17. FIGS. 17 and 18 respectively show a configuration of the display substrate further including non-light emitting areas of the dummy pixels and a configuration of the color conversion substrate further including non-transparent areas corresponding to the non-light emitting areas, and the descriptions of the components that have already been made above are recapitulated or omitted hereinbelow for descriptive convenience.

With reference to FIGS. 17 and 18, the display area DA of the display substrate 100 may include the first, second, and third light emitting areas LA1, LA2, and LA3 and the first, second, and third non-light emitting areas NLA1, NLA2, and NLA3. Each of the first, second, and third light emitting areas LA1, LA2, and LA3 and each of the first, second, and third non-light emitting areas NLA1, NLA2, and NLA3 may be areas, through which the light emitted by the light emitting element radiates outside the display substrate.

The display substrate 100 may include a first base member SUB1, a buffer layer BF, a thin film transistor layer TFTL, a light emitting element EL, and an encapsulation layer TFE. The first base member SUB1, the buffer layer BF, the thin film transistor layer TFTL, the light emitting element EL, and the encapsulation layer TFE are substantially identical in structure to those described with reference to FIG. 5 and thus detailed descriptions thereof are omitted hereinbelow for descriptive convenience.

The color conversion substrate 300 may be disposed above the display substrate 100. The color conversion substrate 300 may include the first, second, and third transparent areas TA1, TA2, and TA3, the first, second, and third non-transparent areas NTA1, NTA2, and NTA3, and the first to sixth light blocking areas BA1 to BA6. The first, second, and third light transparent areas TA1, TA2, and TA3 may correspond to the first, second, and third light emitting areas LA1, LA2, and LA3 of the display substrate 100. The first, second, and third non-transparent areas NTA1, NTA2, and NTA3 may correspond to the first, second, and third non-light emitting areas NLA1, NLA2, and NLA3 of the display substrate 100. The first to sixth light blocking areas BA1 to BA6 may surround the first, second, and third transparent areas TA1, TA2, and TA3 and the first, second, and third non-transparent areas NTA1, NTA2, and NTA3.

The color conversion substrate 300 may include a second base member SUB2, first, second, and third color filters CF1, CF2, and CF3, a first capping layer CAP1, an outer light blocking member OBK, an inner light blocking member IBK, a second capping layer CAP2, first and second wavelength conversion units WLC1 and WLC2, a light transmission unit LTU, and a third capping layer CAP3. The detailed descriptions of the like parts that have been made with reference to FIGS. 5 and 6 are omitted.

The first color filter CF1 may be arranged on the second base member SUB2 to overlap the first transparent area TA1. The first color filter CF1 may selectively pass a first color light (e.g., red light) therethrough and filter out or absorb a second color light (e.g., green light) and a third color light (e.g., blue light).

The second color filter CF2 may be arranged on the second base member SUB2 to overlap the second transparent area TA2. The second color filter CF2 may selectively pass the second color light (e.g., green light) therethrough and filter out or absorb the first color light (e.g., red light) and the third color light (e.g., blue light).

The third color filter CF3 may be arranged on the second base member SUB2 to overlap the third transparent area TA3. The third color filter CF3 may also overlap the first, second, and third light blocking areas BA1, BA2, and BA3. The third color filter CF3 may selectively pass the third color light (e.g., blue light) therethrough and filter out or absorb the first color light (e.g., red light) and the second color light (e.g., green light).

The first, second, and third non-transparent areas NTA1, NTA2, and NTA3 may overlap at least two of the first, second, and third color filters CF1, CF2, and CF3. For example, the third color filter CF3 may be arranged on the second base member SUB2 to overlap the first, second, and third non-transparent areas NTA1, NTA2, and NTA3. The first filter CF1 may be arranged on the third color filter CF3 to overlap the first, second, and third non-transparent areas NTA1, NTA2, and NTA3. That is, the first, second, and third not-transparent areas NTA1, NTA2, and NTA3 are arranged to overlap the first and third color filters CF1 and CF2, thereby blocking the light emitted through the first, second, and third non-emitting areas NLA1, NLA2, and NLA3 of the display substrate 100.

A plurality of light blocking members BK may be disposed above the first, second, and third color filters CF1, CF2, and CF3 so as to respectively overlap a plurality of light blocking areas. The plurality of light block members BK may block light penetration. For example, the plurality of light blocking members BK may prevent light infiltration and color mixture among the first, second, and third transparent areas TA1, TA2, and TA3 such that color reproducibility is improved. The plurality of light blocking members BK may be arranged in the form of a grid surrounding the first, second, and third transparent areas TA1, TA2, and TA3 and the first, second, and third non-transparent areas NTA1, NTA2, and NTA3 in a plan view.

The plurality of light blocking members BK may include outer light blocking members OBK and inner light blocking members IBK. The outer light blocking members OBK may surround the outermost non-transparent areas among the plurality of non-transparent areas. The outer light blocking members OBK may overlap the outermost light blocking areas among the plurality of light blocking areas. As shown in FIGS. 17 and 18, the outer light blocking members OBK may surround the first non-transparent area NTA1 as the outermost one among the plurality of non-transparent areas and may overlap the fourth light blocking area BA4 as the outermost one among the plurality of light blocking areas.

The inner light blocking members IBK may be disposed inside the outer light blocking members OBK to respectively overlap the plurality of light blocking areas. The inner light blocking members IBK may be arranged inside the outer light blocking members OBK positioned in the non-display area NDA and disposed in the display area DA. As shown in FIGS. 17 and 18, the inner light blocking members IBK may overlap the first, second, third, fifth, and sixth light blocking areas BA1, BA2, BA3, BA5, and BA6 except for the fourth light blocking area BA4 as the outermost one among the plurality of light blocking areas.

The outer light blocking member OBK may include first and second outer light blocking members OBK1 and OBK2. The inner light blocking member IBK may include first and second inner light blocking members IBK1 and IBK2.

The first outer light blocking member OBK1 and the first inner light blocking member IBK1 may be arranged above the first, second, and third color filters CF1, CF2, and CF3. For example, the first outer light blocking member OBK1 and the first inner light blocking member IBK1 may be disposed directly on the first capping layer CAP1 formed on the first, second, and third color filters CF1, CF2, and CF3.

The second outer light blocking member OBK2 may include one portion disposed above the first outer light blocking member OBK1 and another portion disposed above the second base member SUB2 to overlap the non-display area NDA. For example, the second outer light blocking member OBK2 may be arranged such that the one portion thereof is disposed directly on the second capping layer to overlap the first outer light blocking member OBK1 and the another portion thereof is disposed directly on the second capping layer CAP2 to overlap the non-display area NDA. The another portion of the second outer light blocking member OBK2 may not overlap the third color filter CF3.

The second outer light blocking member OBK2 may be disposed to cover a top surface and an outer side surface of the first outer light blocking member OBK1. For example, the second capping layer CAP2 may cover the top surface and the outer side surface of the first outer light blocking member OBK1. The second outer light blocking member OBK2 may be disposed directly on the second capping layer CAP2 that covers the top surface and the outer side surface of the first light blocking member OBK1.

The width of the second outer light blocking member OBK2 may be wider than that of the first outer light blocking member OBK1 in a plan view. For example, the second outer light blocking member OBK2 may be arranged so as to be disposed, partially, above the first outer light blocking member OBK1 and extended, partially, in the direction from the first outer light blocking member OBK1 toward the outside of the display device 10. The width of the outer light blocking member OBK may also be wider than that of the inner light blocking member IBK in a plan view. Accordingly the display device 10 may be fabricated such that the height HB4 of the outer light blocking member OBK from the second base member SUB2 is substantially equal to each of the heights HB1, HB2, HB3, HB5, and HB6 of the inner light blocking members IBK from the second base member SUB2.

The second inner light blocking member IBK2 may be disposed above the first light blocking member IBK. For example, the second capping layer CAP2 may cover the top surface and the outer side surface of the first inner light blocking member IBK1, and the second inner light blocking member IBK2 may be disposed directly on the second capping layer CAP2 covering the top side of the first inner light blocking member IBK1.

As shown in FIG. 18, the height HB4 of the outer light blocking member OBK from the second based member SUB2 may be substantially equal to each of the heights HB1, HB2, HB3, HB5, and HB6 of the inner light blocking members IBK from the second base member SUB2. For example, the height HB4 of the external light blocking member OBK from the second base member SUB2 may be substantially equal, within an error margin of about 3%, to each of the heights H1, H2, H3, HB5, and HB6 of the inner light blocking members IBK from the second base member SUB2 in the first, second, third, fifth, and sixth light blocking areas BA1, BA2, BA3, BA5, and BA6.

By fabricating the display device 10 to include the plurality of dummy pixels DPX1, DPX2, and DPX3 as shown in FIGS. 17 and 18, the error margin of the heights of the outer light blocking member OBK and the inner light blocking member IBK as shown in FIG. 18 may become less than the error margin of the heights of the outer light blocking member OBK and the inner light blocking member IBK as shown in FIG. 6.

This makes it possible that the thicknesses of the first and second wavelength conversion units WLC1 and WLC2 and the light transmission unit LTU remain substantially equal to one another, and the thickness of the filler material 700 between the display substrate 100 and the color conversion substrate 300 remains substantially constant/uniform even during the process of laminating the display substrate 100 and the color conversion substrate 300 to fabricate the display device 10. As a consequence, it may be possible to prevent poor lamination and stains.

What is claimed is:
1. A display device comprising:
a first substrate comprising a display area configured to emit a light having a predetermined peak wavelength from a plurality of light emitting areas and a non-display area surrounding the display area; and
a second substrate comprising a plurality of transparent areas overlapping the plurality of light emitting areas of the first substrate, the second substrate configured to convert the peak wavelength of the light or to transmit the light through the plurality of transparent areas,
wherein:
the second substrate comprises:
a base layer comprising the plurality of transparent areas, an inner light blocking area arranged between the plurality of transparent areas, and an outer light blocking area arranged outside the plurality of transparent areas;
a color filter disposed on the base layer; and
a light blocking layer disposed above the color filter and comprising an outer light blocking layer overlapping the outer light blocking area and an inner light blocking layer overlapping the inner light blocking area;

the inner light blocking layer comprises:
a first inner light blocking layer disposed above the color filter; and
a second inner light blocking layer disposed above the first inner light blocking layer;
the outer light blocking layer comprises:
a first outer light blocking layer disposed above the color filter and overlapping the outer light blocking area; and
a second outer light blocking layer disposed partially above the first outer light blocking layer and partially above the base layer to overlap the non-display area;
the second substrate further comprises:
a first capping layer covering the color filter in the display area and covering the base layer in the non-display area; and
a second capping layer disposed between the first inner light blocking layer and the second light blocking layer and between the first outer light blocking layer and the second outer light blocking layer;
a first distance between a top surface of the base layer and a top surface of the second outer light blocking layer is substantially the same as a second distance between a top surface of the base layer and a top surface of the second inner light blocking layer;
the second inner light blocking layer and the second outer light blocking layer are disposed directly on the second capping layer; and
a difference between the first distance and the second distance is within an error margin of about 3%.
2. The display device of claim 1, wherein:
the first substrate is a display substrate, and
the second substrate is a color conversion substrate.
3. The display device of claim 2, wherein the second outer light blocking layer covers a top surface and an outer side surface of the first outer light blocking layer.
4. The display device of claim 2, wherein:
the first inner light blocking layer and the first outer light blocking layer include a black organic material, and
the second inner light blocking layer and the second outer light blocking layer include a black organic material and a liquid repellent component.
5. The display device of claim 1, wherein the color filter comprises:
a first color filter configured to selectively pass a first color light therethrough and overlapping a first transparent area among the plurality of transparent areas;
a second color filter configured to selectively pass a second color light therethrough and overlapping a second transparent area among the plurality of transparent areas; and
a third color filter configured to selectively pass a third color light therethrough and overlapping the inner light blocking area, the outer light blocking area, and a third transparent area among the plurality of transparent areas.
6. The display device of claim 5, wherein the second substrate comprises:
a first wavelength conversion layer disposed above the first color filter and comprising a first wavelength shifter configured to convert a peak wavelength of an incident light to a first peak wavelength;
a second wavelength conversion layer disposed above the second color filter and comprising a second wavelength shifter configured to convert the peak wavelength of the incident light to a second peak wavelength different from the first peak wavelength; and a light transmission layer disposed above the third color filter and configured to pass the incident light therethrough while maintaining the peak wavelength of the incident light.

* * * * *